(12) United States Patent
Ogami et al.

(10) Patent No.: US 10,466,980 B2
(45) Date of Patent: Nov. 5, 2019

(54) TECHNIQUES FOR GENERATING MICROCONTROLLER CONFIGURATION INFORMATION

(71) Applicant: Cypress Semiconductor Corporation, San Jose, CA (US)

(72) Inventors: Kenneth Y. Ogami, Bothell, WA (US); Douglas H. Anderson, Edmonds, WA (US); Matthew A. Pleis, Carnation, WA (US); Frederick Redding Hood, Auburn, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/698,404

(22) Filed: Sep. 7, 2017

(65) Prior Publication Data
US 2018/0088912 A1 Mar. 29, 2018

Related U.S. Application Data

(63) Continuation of application No. 14/445,364, filed on Jul. 29, 2014, now abandoned, which is a
(Continued)

(51) Int. Cl.
*G06F 17/50* (2006.01)
*G06F 8/34* (2018.01)
(Continued)

(52) U.S. Cl.
CPC .............. *G06F 8/34* (2013.01); *G06F 9/22* (2013.01); *G06F 9/44505* (2013.01);
(Continued)

(58) Field of Classification Search
CPC .............. G06F 17/5054; G06F 11/2294; G06F 11/2733; G06F 15/7867; G06F 17/5045;
(Continued)

(56) References Cited

U.S. PATENT DOCUMENTS 3,600,690 A 8/1971 Graham
3,725,804 A 4/1973 Langan
(Continued)

FOREIGN PATENT DOCUMENTS

DE 19710829 C2 9/1998
EP 0308583 A 3/1989
(Continued)

OTHER PUBLICATIONS

"An Analog PPL-Based Clock and Data Recovery Circuit with High Input Jitter Tolerance;" Sun, Reprinted from IEEE Journal of Solid-State Circuits, 1989; 4 pages.
(Continued)

*Primary Examiner* — Vuthe Siek

(57) ABSTRACT

An example includes accessing multiple configurations stored in a memory, where each configuration is associated with a corresponding circuit function implementable by an electronic device and associated with a corresponding set of resources of the electronic device. The example includes determining that one or more sets of resources of the electronic device are available for use by one or more configurations of the multiple configurations. Based on the determination, an embodiment includes representing a first configuration of the one or more configurations, using a graphical interface, and generating instructions that when executed cause the electronic device to be configured according to the first configurations.

5 Claims, 14 Drawing Sheets

Related U.S. Application Data continuation of application No. 13/305,680, filed on Nov. 28, 2011, now Pat. No. 8,793,635, which is a continuation of application No. 11/818,005, filed on Jun. 12, 2007, now Pat. No. 8,069,428, which is a continuation of application No. 10/002,726, filed on Oct. 24, 2001, now Pat. No. 7,406,674.

(51) Int. Cl.
    *G06F 9/22*         (2006.01)
    *G06F 9/445*       (2018.01)

(52) U.S. Cl.
    CPC ........ *G06F 17/505* (2013.01); *G06F 17/5045* (2013.01); *G06F 17/5054* (2013.01)

(58) Field of Classification Search
    CPC ...... G06F 17/5077; G06F 8/34; G06F 17/505; G06F 9/22; G06F 9/44505; G05B 19/056; G05B 2219/13133; G05B 2219/13144; G05B 2219/13145; G05B 2219/13148
    See application file for complete search history.

(56) References Cited

U.S. PATENT DOCUMENTS

| | | |
|---|---|---|
| 3,740,588 A | 6/1973 | Stratton et al. |
| 3,805,245 A | 4/1974 | Brooks et al. |
| 3,810,036 A | 5/1974 | Bloedom |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade |
| 4,272,760 A | 6/1981 | Prazak et al. |
| 4,283,713 A | 8/1981 | Philipp |
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,475,151 A | 10/1984 | Philipp |
| 4,497,575 A | 2/1985 | Philipp |
| 4,604,363 A | 8/1986 | Newhouse et al. |
| 4,608,502 A | 8/1986 | Dijkmans et al. |
| 4,656,603 A | 4/1987 | Dunn |
| 4,670,838 A | 6/1987 | Kawata |
| 4,689,740 A | 8/1987 | Moelands et al. |
| 4,692,718 A | 9/1987 | Roza et al. |
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,807,183 A | 2/1989 | Kung et al. |
| 4,809,345 A | 2/1989 | Tabata et al. |
| 4,812,684 A | 3/1989 | Yamagiwa et al. |
| 4,813,013 A | 3/1989 | Dunn |
| 4,827,401 A | 5/1989 | Hrustich et al. |
| 4,831,546 A | 5/1989 | Mitsuta et al. |
| 4,833,418 A | 5/1989 | Quintus et al. |
| 4,868,525 A | 9/1989 | Dias |
| 4,876,466 A | 10/1989 | Kondou et al. |
| 4,876,534 A | 10/1989 | Mead et al. |
| 4,878,200 A | 10/1989 | Asghar et al. |
| 4,879,461 A | 11/1989 | Philipp |
| 4,879,688 A | 11/1989 | Turner et al. |
| 4,885,484 A | 12/1989 | Gray |
| 4,907,121 A | 3/1990 | Hrassky |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Warren |
| 5,095,284 A | 3/1992 | Mead |
| 5,097,305 A | 3/1992 | Mead et al. |
| 5,099,191 A | 3/1992 | Galler et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada, Jr. et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,184,061 A | 2/1993 | Lee et al. |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,225,991 A | 7/1993 | Dougherty |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,739 A | 1/1994 | Krokstad et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerpheide |
| 5,305,312 A | 4/1994 | Fornek et al. |
| 5,307,381 A | 4/1994 | Ahuja |

(56) References Cited

U.S. PATENT DOCUMENTS

| | | |
|---|---|---|
| 5,313,618 A | 5/1994 | Pawloski |
| 5,317,202 A | 5/1994 | Waizman |
| 5,319,370 A | 6/1994 | Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,335,342 A | 8/1994 | Pope et al. |
| 5,336,936 A | 8/1994 | Allen et al. |
| 5,339,213 A | 8/1994 | O'Callaghan |
| 5,339,262 A | 8/1994 | Rostoker et al. |
| 5,341,044 A | 8/1994 | Ahanin et al. |
| 5,341,267 A | 8/1994 | Whitten et al. |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Herczeg et al. |
| 5,371,860 A | 12/1994 | Mura et al. |
| 5,371,878 A | 12/1994 | Coker |
| 5,371,883 A | 12/1994 | Gross et al. |
| 5,374,787 A | 12/1994 | Miller et al. |
| 5,377,333 A | 12/1994 | Nakagoshi et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,390,173 A | 2/1995 | Spinney et al. |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |
| 5,399,922 A | 3/1995 | Kiani et al. |
| 5,408,194 A | 4/1995 | Steinbach et al. |
| 5,408,235 A | 4/1995 | Doyle et al. |
| 5,414,308 A | 5/1995 | Lee et al. |
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |
| 5,426,378 A | 6/1995 | Ong |
| 5,426,384 A | 6/1995 | May |
| 5,428,319 A | 6/1995 | Marvin et al. |
| 5,430,395 A | 7/1995 | Ichimaru |
| 5,430,687 A | 7/1995 | Hung et al. |
| 5,430,734 A | 7/1995 | Gilson |
| 5,432,476 A | 7/1995 | Tran |
| 5,438,672 A | 8/1995 | Dey |
| 5,440,305 A | 8/1995 | Signore et al. |
| 5,451,887 A | 9/1995 | El Ayat et al. |
| 5,453,904 A | 9/1995 | Higashiyama et al. |
| 5,455,525 A | 10/1995 | Ho et al. |
| 5,455,731 A | 10/1995 | Parkinson |
| 5,455,927 A | 10/1995 | Huang |
| 5,457,410 A | 10/1995 | Ting |
| 5,457,479 A | 10/1995 | Cheng |
| 5,463,591 A | 10/1995 | Aimoto et al. |
| 5,479,603 A | 12/1995 | Stone et al. |
| 5,479,643 A | 12/1995 | Bhaskar et al. |
| 5,479,652 A | 12/1995 | Dreyer et al. |
| 5,481,471 A | 1/1996 | Naglestad et al. |
| 5,488,204 A | 1/1996 | Mead et al. |
| 5,491,458 A | 2/1996 | Mccune, Jr. et al. |
| 5,493,246 A | 2/1996 | Anderson |
| 5,493,723 A | 2/1996 | Beck et al. |
| 5,495,077 A | 2/1996 | Miller et al. |
| 5,495,593 A | 2/1996 | Elmer et al. |
| 5,495,594 A | 2/1996 | Mackenna et al. |
| 5,497,119 A | 3/1996 | Tedrow et al. |
| 5,499,192 A | 3/1996 | Knapp et al. |
| 5,500,823 A | 3/1996 | Martin et al. |
| 5,517,198 A | 5/1996 | Mcewan |
| 5,519,854 A | 5/1996 | Watt |
| 5,521,529 A | 5/1996 | Agrawal et al. |
| 5,530,444 A | 6/1996 | Tice et al. |
| 5,530,673 A | 6/1996 | Tobita et al. |
| 5,530,813 A | 6/1996 | Paulsen et al. |
| 5,537,057 A | 7/1996 | Leong et al. |
| 5,541,878 A | 7/1996 | LeMoncheck et al. |
| 5,542,055 A | 7/1996 | Amini et al. |
| 5,543,588 A | 8/1996 | Bisset et al. |
| 5,543,590 A | 8/1996 | Gillespie et al. |
| 5,543,591 A | 8/1996 | Gillespie et al. |
| 5,544,067 A | 8/1996 | Rostoker et al. |
| 5,544,311 A | 8/1996 | Harenberg et al. |
| 5,546,433 A | 8/1996 | Tran et al. |
| 5,546,562 A | 8/1996 | Patel |
| 5,550,839 A | 8/1996 | Buch et al. |
| 5,552,725 A | 9/1996 | Ray et al. |
| 5,552,748 A | 9/1996 | O'Shaughnessy |
| 5,554,951 A | 9/1996 | Gough |
| 5,555,452 A | 9/1996 | Callaway et al. |
| 5,555,907 A | 9/1996 | Philipp |
| 5,557,762 A | 9/1996 | Okuaki et al. |
| 5,559,502 A | 9/1996 | Schutte |
| 5,559,996 A | 9/1996 | Fujioka |
| 5,563,526 A | 10/1996 | Hastings et al. |
| 5,563,529 A | 10/1996 | Seltzer et al. |
| 5,564,010 A | 10/1996 | Henry et al. |
| 5,564,108 A | 10/1996 | Hunsaker et al. |
| 5,565,658 A | 10/1996 | Gerpheide et al. |
| 5,566,702 A | 10/1996 | Philipp |
| 5,572,665 A | 11/1996 | Nakabayashi |
| 5,572,719 A | 11/1996 | Biesterfeldt |
| 5,574,678 A | 11/1996 | Gorecki |
| 5,574,852 A | 11/1996 | Bakker et al. |
| 5,574,892 A | 11/1996 | Christensen |
| 5,579,353 A | 11/1996 | Parmenter et al. |
| 5,587,945 A | 12/1996 | Lin et al. |
| 5,587,957 A | 12/1996 | Kowalczyk et al. |
| 5,590,354 A | 12/1996 | Klapproth et al. |
| 5,594,388 A | 1/1997 | O'Shaughnessy et al. |
| 5,594,734 A | 1/1997 | Worsley et al. |
| 5,594,876 A | 1/1997 | Getzlaff et al. |
| 5,594,890 A | 1/1997 | Yamaura et al. |
| 5,600,262 A | 2/1997 | Kolze |
| 5,604,466 A | 2/1997 | Dreps et al. |
| 5,608,892 A | 3/1997 | Wakerly |
| 5,614,861 A | 3/1997 | Harada |
| 5,625,316 A | 4/1997 | Chambers et al. |
| 5,625,583 A | 4/1997 | Hyatt |
| 5,629,857 A | 5/1997 | Brennan |
| 5,629,891 A | 5/1997 | LeMoncheck et al. |
| 5,630,052 A | 5/1997 | Shah |
| 5,630,057 A | 5/1997 | Hait |
| 5,630,102 A | 5/1997 | Johnson et al. |
| 5,631,577 A | 5/1997 | Freidin et al. |
| 5,633,766 A | 5/1997 | Hase et al. |
| 5,642,295 A | 6/1997 | Smayling |
| 5,646,544 A | 7/1997 | Iadanza |
| 5,646,901 A | 7/1997 | Sharpe-Geisler et al. |
| 5,648,642 A | 7/1997 | Miller et al. |
| 5,651,035 A | 7/1997 | Tozun et al. |
| 5,661,433 A | 8/1997 | LaRosa et al. |
| 5,663,900 A | 9/1997 | Bhandari et al. |
| 5,663,965 A | 9/1997 | Seymour |
| 5,664,199 A | 9/1997 | Kuwahara |
| 5,666,480 A | 9/1997 | Leung et al. |
| 5,670,915 A | 9/1997 | Cooper et al. |
| 5,673,198 A | 9/1997 | Lawman et al. |
| 5,675,825 A | 10/1997 | Dreyer et al. |
| 5,677,691 A | 10/1997 | Hosticka et al. |
| 5,680,070 A | 10/1997 | Anderson et al. |
| 5,682,032 A | 10/1997 | Philipp |
| 5,684,434 A | 11/1997 | Mann et al. |
| 5,684,952 A | 11/1997 | Stein |
| 5,686,844 A | 11/1997 | Hull et al. |

(56) References Cited

U.S. PATENT DOCUMENTS

| | | |
|---|---|---|
| 5,687,325 A | 11/1997 | Chang |
| 5,689,195 A | 11/1997 | Cliff et al. |
| 5,689,196 A | 11/1997 | Schulte |
| 5,691,664 A | 11/1997 | Anderson et al. |
| 5,691,898 A | 11/1997 | Rosenberg et al. |
| 5,694,063 A | 12/1997 | Burlison et al. |
| 5,696,952 A | 12/1997 | Pontarelli |
| 5,699,024 A | 12/1997 | Manlove et al. |
| 5,703,871 A | 12/1997 | Pope et al. |
| 5,706,453 A | 1/1998 | Cheng et al. |
| 5,708,589 A | 1/1998 | Beauvais |
| 5,708,798 A | 1/1998 | Lynch et al. |
| 5,710,906 A | 1/1998 | Ghosh et al. |
| 5,712,969 A | 1/1998 | Zimmermann et al. |
| 5,721,931 A | 2/1998 | Gephardt et al. |
| 5,724,009 A | 3/1998 | Collins et al. |
| 5,727,170 A | 3/1998 | Mitchell et al. |
| 5,728,933 A | 3/1998 | Schultz et al. |
| 5,729,704 A | 3/1998 | Stone et al. |
| 5,730,165 A | 3/1998 | Philipp |
| 5,732,277 A | 3/1998 | Kodosky et al. |
| 5,734,272 A | 3/1998 | Belot et al. |
| 5,734,334 A | 3/1998 | Hsieh et al. |
| 5,737,557 A | 4/1998 | Sullivan |
| 5,737,760 A | 4/1998 | Grimmer et al. |
| 5,745,011 A | 4/1998 | Scott |
| 5,748,048 A | 5/1998 | Moyal |
| 5,748,875 A | 5/1998 | Tzori |
| 5,751,164 A | 5/1998 | Sharpe-Geisler et al. |
| 5,752,013 A | 5/1998 | Christensen et al. |
| 5,754,552 A | 5/1998 | Allmond et al. |
| 5,754,826 A | 5/1998 | Gamal et al. |
| 5,757,368 A | 5/1998 | Gerpheide et al. |
| 5,758,058 A | 5/1998 | Milburn |
| 5,761,128 A | 6/1998 | Watanabe |
| 5,763,909 A | 6/1998 | Mead et al. |
| 5,764,714 A | 6/1998 | Stansell et al. |
| 5,767,457 A | 6/1998 | Gerpheide et al. |
| 5,774,704 A | 6/1998 | Williams |
| 5,777,399 A | 7/1998 | Shibuya |
| 5,781,030 A | 7/1998 | Agrawal et al. |
| 5,781,747 A | 7/1998 | Smith et al. |
| 5,784,545 A | 7/1998 | Anderson et al. |
| 5,790,957 A | 8/1998 | Heidari |
| 5,796,183 A | 8/1998 | Hourmand |
| 5,799,176 A | 8/1998 | Kapusta et al. |
| 5,801,958 A | 9/1998 | Dangelo et al. |
| 5,802,073 A | 9/1998 | Platt |
| 5,802,290 A | 9/1998 | Casselman |
| 5,805,792 A | 9/1998 | Swoboda et al. |
| 5,805,897 A | 9/1998 | Glowny |
| 5,808,883 A | 9/1998 | Hawkes |
| 5,811,987 A | 9/1998 | Ashmore, Jr. et al. |
| 5,812,698 A | 9/1998 | Platt et al. |
| 5,818,254 A | 10/1998 | Agrawal et al. |
| 5,818,444 A | 10/1998 | Alimpich et al. |
| 5,818,736 A | 10/1998 | Leibold |
| 5,819,028 A | 10/1998 | Manghirmalani et al. |
| 5,822,387 A | 10/1998 | Mar |
| 5,822,531 A | 10/1998 | Gorczyca et al. |
| 5,828,693 A | 10/1998 | Mays et al. |
| 5,838,583 A | 11/1998 | Varadarajan et al. |
| 5,841,078 A | 11/1998 | Miller et al. |
| 5,841,996 A | 11/1998 | Nolan et al. |
| 5,844,265 A | 12/1998 | Mead et al. |
| 5,844,404 A | 12/1998 | Caser et al. |
| 5,848,285 A | 12/1998 | Kapusta et al. |
| 5,850,156 A | 12/1998 | Wittman |
| 5,852,733 A | 12/1998 | Chien et al. |
| 5,854,625 A | 12/1998 | Frisch et al. |
| 5,857,109 A | 1/1999 | Taylor |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,867,046 A | 2/1999 | Sugasawa |
| 5,867,399 A | 2/1999 | Rostoker et al. |
| 5,869,979 A | 2/1999 | Bocchino |
| 5,870,004 A | 2/1999 | Lu |
| 5,870,309 A | 2/1999 | Lawman |
| 5,870,345 A | 2/1999 | Stecker |
| 5,872,464 A | 2/1999 | Gradinariu |
| 5,874,958 A | 2/1999 | Ludolph |
| 5,875,293 A | 2/1999 | Bell et al. |
| 5,877,656 A | 3/1999 | Mann et al. |
| 5,878,425 A | 3/1999 | Redpath |
| 5,880,411 A | 3/1999 | Gillespie et al. |
| 5,880,598 A | 3/1999 | Duong |
| 5,883,623 A | 3/1999 | Cseri |
| 5,886,582 A | 3/1999 | Stansell |
| 5,887,189 A | 3/1999 | Birns et al. |
| 5,889,236 A | 3/1999 | Gillespie et al. |
| 5,889,723 A | 3/1999 | Pascucci |
| 5,889,936 A | 3/1999 | Chan |
| 5,889,988 A | 3/1999 | Held |
| 5,894,226 A | 4/1999 | Koyama |
| 5,894,243 A | 4/1999 | Hwang |
| 5,894,565 A | 4/1999 | Furtek et al. |
| 5,895,494 A | 4/1999 | Scalzi et al. |
| 5,896,068 A | 4/1999 | Moyal |
| 5,896,330 A | 4/1999 | Gibson |
| 5,898,345 A | 4/1999 | Namura et al. |
| 5,900,780 A | 5/1999 | Hirose et al. |
| 5,901,062 A | 5/1999 | Burch et al. |
| 5,903,718 A | 5/1999 | Marik |
| 5,905,398 A | 5/1999 | Todsen et al. |
| 5,909,544 A | 6/1999 | Anderson et al. |
| 5,911,059 A | 6/1999 | Profit, Jr. |
| 5,914,465 A | 6/1999 | Allen et al. |
| 5,914,633 A | 6/1999 | Comino et al. |
| 5,914,708 A | 6/1999 | LaGrange et al. |
| 5,917,356 A | 6/1999 | Casal et al. |
| 5,920,310 A | 7/1999 | Faggin et al. |
| 5,923,264 A | 7/1999 | Lavelle et al. |
| 5,926,566 A | 7/1999 | Wang et al. |
| 5,929,710 A | 7/1999 | Bien |
| 5,930,148 A | 7/1999 | Bjorksten et al. |
| 5,930,150 A | 7/1999 | Cohen et al. |
| 5,931,959 A | 8/1999 | Kwiat |
| 5,933,023 A | 8/1999 | Young |
| 5,933,356 A | 8/1999 | Rostoker et al. |
| 5,933,816 A | 8/1999 | Zeanah et al. |
| 5,935,233 A | 8/1999 | Jeddeloh |
| 5,935,266 A | 8/1999 | Thurnhofer et al. |
| 5,937,190 A | 8/1999 | Gregory et al. |
| 5,939,904 A | 8/1999 | Fetterman et al. |
| 5,939,949 A | 8/1999 | Olgaard et al. |
| 5,941,991 A | 8/1999 | Kageshima |
| 5,942,733 A | 8/1999 | Allen et al. |
| 5,943,052 A | 8/1999 | Allen et al. |
| 5,945,878 A | 8/1999 | Westwick et al. |
| 5,946,219 A | 8/1999 | Mason et al. |
| 5,949,632 A | 9/1999 | Barreras, Sr. et al. |
| 5,952,888 A | 9/1999 | Scott |
| 5,956,279 A | 9/1999 | Mo et al. |
| 5,959,871 A | 9/1999 | Pierzchala et al. |
| 5,963,075 A | 10/1999 | Hiiragizawa |
| 5,963,105 A | 10/1999 | Nguyen |
| 5,963,503 A | 10/1999 | Lee |
| 5,964,893 A | 10/1999 | Circello et al. |
| 5,966,027 A | 10/1999 | Kapusta et al. |
| 5,966,532 A | 10/1999 | Mcdonald et al. |
| 5,968,135 A | 10/1999 | Teramoto et al. |
| 5,969,513 A | 10/1999 | Clark |
| 5,969,632 A | 10/1999 | Diamant et al. |
| 5,973,368 A | 10/1999 | Pearce et al. |
| 5,974,235 A | 10/1999 | Nunally et al. |
| 5,977,791 A | 11/1999 | Veenstra |
| 5,978,584 A | 11/1999 | Nishibata et al. |
| 5,978,937 A | 11/1999 | Miyamori et al. |
| 5,982,105 A | 11/1999 | Masters |
| 5,982,229 A | 11/1999 | Wong et al. |
| 5,982,241 A | 11/1999 | Nguyen et al. |
| 5,983,277 A | 11/1999 | Heile et al. |

(56) References Cited

U.S. PATENT DOCUMENTS

| | | |
|---|---|---|
| 5,986,479 A | 11/1999 | Mohan |
| 5,987,246 A | 11/1999 | Thomsen et al. |
| 5,988,902 A | 11/1999 | Holehan |
| 5,994,939 A | 11/1999 | Johnson et al. |
| 5,996,032 A | 11/1999 | Baker |
| 5,999,725 A | 12/1999 | Barbier et al. |
| 6,002,268 A | 12/1999 | Sasaki et al. |
| 6,002,398 A | 12/1999 | Wilson |
| 6,003,054 A | 12/1999 | Oshima et al. |
| 6,003,107 A | 12/1999 | Ranson et al. |
| 6,003,133 A | 12/1999 | Moughanni et al. |
| 6,005,814 A | 12/1999 | Mulholland et al. |
| 6,005,904 A | 12/1999 | Knapp et al. |
| 6,008,685 A | 12/1999 | Kunst |
| 6,008,703 A | 12/1999 | Perrott et al. |
| 6,009,270 A | 12/1999 | Mann |
| 6,009,496 A | 12/1999 | Tsai |
| 6,011,407 A | 1/2000 | New |
| 6,012,835 A | 1/2000 | Thompson et al. |
| 6,014,135 A | 1/2000 | Fernandes |
| 6,014,509 A | 1/2000 | Furtek et al. |
| 6,014,723 A | 1/2000 | Tremblay et al. |
| 6,016,554 A | 1/2000 | Skrovan et al. |
| 6,016,563 A | 1/2000 | Fleisher |
| 6,018,559 A | 1/2000 | Azegami et al. |
| 6,023,422 A | 2/2000 | Allen et al. |
| 6,023,565 A | 2/2000 | Lawman et al. |
| 6,026,134 A | 2/2000 | Duffy et al. |
| 6,026,501 A | 2/2000 | Hohl et al. |
| 6,028,271 A | 2/2000 | Gillespie et al. |
| 6,028,959 A | 2/2000 | Wang et al. |
| 6,031,365 A | 2/2000 | Sharpe-Geisler |
| 6,032,268 A | 2/2000 | Swoboda et al. |
| 6,034,538 A | 3/2000 | Abramovici |
| 6,034,541 A | 3/2000 | Kopec, Jr. et al. |
| 6,035,320 A | 3/2000 | Kiriaki et al. |
| 6,037,807 A | 3/2000 | Wu et al. |
| 6,038,551 A | 3/2000 | Barlow et al. |
| 6,041,406 A | 3/2000 | Mann |
| 6,043,695 A | 3/2000 | O'Sullivan |
| 6,043,719 A | 3/2000 | Lin et al. |
| 6,049,223 A | 4/2000 | Lytle et al. |
| 6,049,225 A | 4/2000 | Huang et al. |
| 6,051,772 A | 4/2000 | Cameron et al. |
| 6,052,035 A | 4/2000 | Nolan et al. |
| 6,052,524 A | 4/2000 | Pauna |
| 6,055,584 A | 4/2000 | Bridges et al. |
| 6,057,705 A | 5/2000 | Wojewoda et al. |
| 6,058,263 A | 5/2000 | Voth |
| 6,058,452 A | 5/2000 | Rangasayee et al. |
| 6,061,511 A | 5/2000 | Marantz et al. |
| 6,066,961 A | 5/2000 | Lee et al. |
| 6,070,003 A | 5/2000 | Gove et al. |
| 6,072,803 A | 6/2000 | Allmond et al. |
| 6,075,941 A | 6/2000 | Itoh et al. |
| 6,079,985 A | 6/2000 | Wohl et al. |
| 6,081,140 A | 6/2000 | King |
| 6,094,730 A | 7/2000 | Lopez et al. |
| 6,097,211 A | 8/2000 | Couts-Martin et al. |
| 6,097,432 A | 8/2000 | Mead et al. |
| 6,101,457 A | 8/2000 | Barch et al. |
| 6,101,617 A | 8/2000 | Burckhartt et al. |
| 6,104,217 A | 8/2000 | Magana |
| 6,104,325 A | 8/2000 | Liaw et al. |
| 6,107,769 A | 8/2000 | Saylor et al. |
| 6,107,826 A | 8/2000 | Young et al. |
| 6,107,882 A | 8/2000 | Gabara et al. |
| 6,110,223 A | 8/2000 | Southgate et al. |
| 6,111,431 A | 8/2000 | Estrada |
| 6,112,264 A | 8/2000 | Beasley et al. |
| 6,121,791 A | 9/2000 | Abbott |
| 6,121,805 A | 9/2000 | Thamsirianunt et al. |
| 6,121,965 A | 9/2000 | Kenney et al. |
| 6,125,416 A | 9/2000 | Warren |
| 6,130,548 A | 10/2000 | Koifman |
| 6,130,551 A | 10/2000 | Agrawal et al. |
| 6,130,552 A | 10/2000 | Jefferson et al. |
| 6,133,773 A | 10/2000 | Garlepp et al. |
| 6,134,181 A | 10/2000 | Landry |
| 6,134,516 A | 10/2000 | Wang et al. |
| 6,137,308 A | 10/2000 | Nayak |
| 6,140,853 A | 10/2000 | Lo |
| 6,141,376 A | 10/2000 | Shaw |
| 6,141,764 A | 10/2000 | Ezell |
| 6,144,327 A | 11/2000 | Distinti et al. |
| 6,148,104 A | 11/2000 | Wang et al. |
| 6,148,441 A | 11/2000 | Woodward |
| 6,149,299 A | 11/2000 | Aslan et al. |
| 6,150,866 A | 11/2000 | Eto et al. |
| 6,154,064 A | 11/2000 | Proebsting |
| 6,157,024 A | 12/2000 | Chapdelaine et al. |
| 6,157,270 A | 12/2000 | Tso |
| 6,161,199 A | 12/2000 | Szeto et al. |
| 6,166,367 A | 12/2000 | Cho |
| 6,166,960 A | 12/2000 | Marneweck et al. |
| 6,167,077 A | 12/2000 | Ducaroir et al. |
| 6,167,364 A | 12/2000 | Stellenberg et al. |
| 6,167,559 A | 12/2000 | Furtek et al. |
| 6,169,383 B1 | 1/2001 | Sabin et al. |
| 6,172,571 B1 | 1/2001 | Moyal et al. |
| 6,173,419 B1 | 1/2001 | Barnett |
| 6,175,914 B1 | 1/2001 | Mann |
| 6,175,949 B1 | 1/2001 | Gristede et al. |
| 6,181,163 B1 | 1/2001 | Agrawal et al. |
| 6,183,131 B1 | 2/2001 | Holloway et al. |
| 6,185,127 B1 | 2/2001 | Myers et al. |
| 6,185,450 B1 | 2/2001 | Seguine et al. |
| 6,185,522 B1 | 2/2001 | Bakker |
| 6,185,703 B1 | 2/2001 | Guddat et al. |
| 6,185,732 B1 | 2/2001 | Mann et al. |
| 6,188,228 B1 | 2/2001 | Philipp |
| 6,188,241 B1 | 2/2001 | Gauthier et al. |
| 6,188,381 B1 | 2/2001 | Van Der et al. |
| 6,188,391 B1 | 2/2001 | Seely et al. |
| 6,188,975 B1 | 2/2001 | Gay |
| 6,191,603 B1 | 2/2001 | Muradali et al. |
| 6,191,660 B1 | 2/2001 | Mar et al. |
| 6,191,998 B1 | 2/2001 | Reddy et al. |
| 6,192,431 B1 | 2/2001 | Dabral et al. |
| 6,198,303 B1 | 3/2001 | Rangasayee |
| 6,201,407 B1 | 3/2001 | Kapusta et al. |
| 6,201,829 B1 | 3/2001 | Schneider |
| 6,202,044 B1 | 3/2001 | Tzori |
| 6,204,687 B1 | 3/2001 | Schultz et al. |
| 6,205,574 B1 | 3/2001 | Dellinger et al. |
| 6,208,572 B1 | 3/2001 | Adams |
| 6,211,708 B1 | 4/2001 | Klemmer |
| 6,211,715 B1 | 4/2001 | Terauchi |
| 6,211,741 B1 | 4/2001 | Dalmia |
| 6,215,352 B1 | 4/2001 | Sudo |
| 6,216,254 B1 | 4/2001 | Pesce et al. |
| 6,219,729 B1 | 4/2001 | Keats et al. |
| 6,222,528 B1 | 4/2001 | Gerpheide et al. |
| 6,223,144 B1 | 4/2001 | Barnett et al. |
| 6,223,147 B1 | 4/2001 | Bowers |
| 6,223,272 B1 | 4/2001 | Coehlo et al. |
| RE37,195 E | 5/2001 | Kean |
| 6,225,866 B1 | 5/2001 | Kubota et al. |
| 6,236,242 B1 | 5/2001 | Hedberg |
| 6,236,275 B1 | 5/2001 | Dent |
| 6,236,278 B1 | 5/2001 | Olgaard |
| 6,236,593 B1 | 5/2001 | Hong et al. |
| 6,239,389 B1 | 5/2001 | Allen et al. |
| 6,239,798 B1 | 5/2001 | Ludolph et al. |
| 6,240,375 B1 | 5/2001 | Sonoda |
| 6,246,258 B1 | 6/2001 | Lesea |
| 6,246,410 B1 | 6/2001 | Bergeron et al. |
| 6,249,167 B1 | 6/2001 | Oguchi et al. |
| 6,249,447 B1 | 6/2001 | Boylan et al. |
| 6,253,250 B1 | 6/2001 | Evans et al. |
| 6,253,754 B1 | 7/2001 | Roohparvar |
| 6,262,717 B1 | 7/2001 | Donohue et al. |
| 6,263,302 B1 | 7/2001 | Hellestrand et al. |
| 6,263,339 B1 | 7/2001 | Hirsch |

(56) References Cited

U.S. PATENT DOCUMENTS

| | | |
|---|---|---|
| 6,263,484 B1 | 7/2001 | Yang |
| 6,271,679 B1 | 8/2001 | Mcclintock et al. |
| 6,272,646 B1 | 8/2001 | Rangasayee et al. |
| 6,275,117 B1 | 8/2001 | Abugharbieh et al. |
| 6,278,568 B1 | 8/2001 | Cloke et al. |
| 6,280,391 B1 | 8/2001 | Olson et al. |
| 6,281,753 B1 | 8/2001 | Corsi et al. |
| 6,282,547 B1 | 8/2001 | Hirsch |
| 6,282,551 B1 | 8/2001 | Anderson et al. |
| 6,286,127 B1 | 9/2001 | King et al. |
| 6,288,707 B1 | 9/2001 | Philipp |
| 6,289,300 B1 | 9/2001 | Brannick et al. |
| 6,289,478 B1 | 9/2001 | Kitagaki |
| 6,289,489 B1 | 9/2001 | Bold et al. |
| 6,292,028 B1 | 9/2001 | Tomita |
| 6,294,932 B1 | 9/2001 | Watarai |
| 6,294,962 B1 | 9/2001 | Mar |
| 6,298,320 B1 | 10/2001 | Buckmaster et al. |
| 6,304,014 B1 | 10/2001 | England et al. |
| 6,304,101 B1 | 10/2001 | Nishihara |
| 6,304,790 B1 | 10/2001 | Nakamura et al. |
| 6,307,413 B1 | 10/2001 | Dalmia et al. |
| 6,310,521 B1 | 10/2001 | Dalmia |
| 6,310,611 B1 | 10/2001 | Caldwell |
| 6,311,149 B1 | 10/2001 | Ryan et al. |
| 6,314,530 B1 | 11/2001 | Mann |
| 6,320,184 B1 | 11/2001 | Winklhofer et al. |
| 6,320,282 B1 | 11/2001 | Caldwell |
| 6,321,369 B1 | 11/2001 | Heile et al. |
| 6,323,846 B1 | 11/2001 | Westerman et al. |
| 6,324,628 B1 | 11/2001 | Chan |
| 6,324,672 B1 | 11/2001 | Lawman et al. |
| 6,326,859 B1 | 12/2001 | Goldman et al. |
| 6,332,137 B1 | 12/2001 | Hori et al. |
| 6,332,201 B1 | 12/2001 | Chin et al. |
| 6,337,579 B1 | 1/2002 | Mochida |
| 6,338,109 B1 | 1/2002 | Snyder et al. |
| 6,339,815 B1 | 1/2002 | Feng et al. |
| 6,342,907 B1 | 1/2002 | Petty et al. |
| 6,345,383 B1 | 2/2002 | Ueki |
| 6,347,395 B1 | 2/2002 | Payne et al. |
| 6,351,789 B1 | 2/2002 | Green |
| 6,353,452 B1 | 3/2002 | Hamada et al. |
| 6,355,980 B1 | 3/2002 | Callahan |
| 6,356,862 B2 | 3/2002 | Bailey |
| 6,356,958 B1 | 3/2002 | Lin |
| 6,356,960 B1 | 3/2002 | Jones et al. |
| 6,359,950 B2 | 3/2002 | Gossmann et al. |
| 6,362,697 B1 | 3/2002 | Pulvirenti |
| 6,363,463 B1 | 3/2002 | Mattison |
| 6,366,174 B1 | 4/2002 | Berry et al. |
| 6,366,300 B1 | 4/2002 | Ohara et al. |
| 6,366,874 B1 | 4/2002 | Lee et al. |
| 6,366,878 B1 | 4/2002 | Grunert |
| 6,369,660 B1 | 4/2002 | Wei et al. |
| 6,371,878 B1 | 4/2002 | Bowen |
| 6,373,954 B1 | 4/2002 | Malcolm, Jr. et al. |
| 6,374,370 B1 | 4/2002 | Bockhaus et al. |
| 6,377,009 B1 | 4/2002 | Philipp |
| 6,377,575 B1 | 4/2002 | Mullaney et al. |
| 6,377,646 B1 | 4/2002 | Sha |
| 6,380,811 B1 | 4/2002 | Zarubinsky et al. |
| 6,380,929 B1 | 4/2002 | Platt |
| 6,380,931 B1 | 4/2002 | Gillespie et al. |
| 6,384,947 B1 | 5/2002 | Ackerman et al. |
| 6,385,742 B1 | 5/2002 | Kirsch et al. |
| 6,388,109 B1 | 5/2002 | Schwarz et al. |
| 6,388,464 B1 | 5/2002 | Lacey et al. |
| 6,396,302 B2 | 5/2002 | New et al. |
| 6,396,657 B1 | 5/2002 | Suzuki |
| 6,397,232 B1 | 5/2002 | Cheng-Hung et al. |
| 6,401,230 B1 | 6/2002 | Ahanessians et al. |
| 6,404,204 B1 | 6/2002 | Farruggia et al. |
| 6,404,445 B1 | 6/2002 | Galea et al. |
| 6,407,953 B1 | 6/2002 | Cleeves |
| 6,408,432 B1 | 6/2002 | Herrmann et al. |
| 6,411,665 B1 | 6/2002 | Chan et al. |
| 6,411,974 B1 | 6/2002 | Graham et al. |
| 6,414,671 B1 | 7/2002 | Gillespie et al. |
| 6,421,698 B1 | 7/2002 | Hong |
| 6,421,817 B1 | 7/2002 | Mohan et al. |
| 6,425,109 B1 | 7/2002 | Choukalos et al. |
| 4,701,907 A1 | 8/2002 | Collins |
| 6,429,882 B1 | 8/2002 | Abdelnur et al. |
| 6,430,305 B1 | 8/2002 | Decker |
| 6,433,645 B1 | 8/2002 | Mann et al. |
| 6,434,187 B1 | 8/2002 | Beard et al. |
| 6,437,805 B1 | 8/2002 | Sojoodi et al. |
| 6,438,565 B1 | 8/2002 | Ammirato et al. |
| 6,438,735 B1 | 8/2002 | McElvain et al. |
| 6,438,738 B1 | 8/2002 | Elayda |
| 6,441,073 B1 | 8/2002 | Tanaka et al. |
| 6,445,211 B1 | 9/2002 | Saripella |
| 6,449,628 B1 | 9/2002 | Wasson |
| 6,449,755 B1 | 9/2002 | Beausang et al. |
| 6,449,761 B1 | 9/2002 | Greidinger et al. |
| 6,452,437 B1 | 9/2002 | Takeuchi et al. |
| 6,452,514 B1 | 9/2002 | Philipp |
| 6,453,175 B2 | 9/2002 | Mizell et al. |
| 6,453,461 B1 | 9/2002 | Chaiken |
| 6,456,304 B1 | 9/2002 | Angiulo et al. |
| 6,457,355 B1 | 10/2002 | Philipp |
| 6,457,479 B1 | 10/2002 | Zhuang et al. |
| 6,460,172 B1 | 10/2002 | Farre et al. |
| 6,463,488 B1 | 10/2002 | San Juan |
| 6,466,036 B1 | 10/2002 | Philipp |
| 6,466,078 B1 | 10/2002 | Stiff |
| 6,466,898 B1 | 10/2002 | Chan |
| 6,473,069 B1 | 10/2002 | Gerpheide |
| 6,473,825 B1 | 10/2002 | Worley et al. |
| 6,477,691 B1 | 11/2002 | Bergamaschi et al. |
| 6,480,921 B1 | 11/2002 | Mansoorian et al. |
| 6,483,343 B1 | 11/2002 | Faith et al. |
| 6,487,700 B1 | 11/2002 | Fukushima |
| 6,489,899 B1 | 12/2002 | Ely et al. |
| 6,490,213 B1 | 12/2002 | Mu et al. |
| 6,492,834 B1 | 12/2002 | Lytle et al. |
| 6,496,969 B2 | 12/2002 | Feng et al. |
| 6,496,971 B1 | 12/2002 | Lesea et al. |
| 6,498,720 B2 | 12/2002 | Glad |
| 6,499,134 B1 | 12/2002 | Buffet et al. |
| 6,499,359 B1 | 12/2002 | Washeleski et al. |
| 6,504,403 B2 | 1/2003 | Bangs et al. |
| 6,507,214 B1 | 1/2003 | Snyder |
| 6,507,215 B1 | 1/2003 | Piasecki et al. |
| 6,507,857 B1 | 1/2003 | Yalcinalp |
| 6,509,758 B2 | 1/2003 | Piasecki et al. |
| 6,512,395 B1 | 1/2003 | Lacey et al. |
| 6,516,428 B2 | 2/2003 | Wenzel et al. |
| 6,522,128 B1 | 2/2003 | Ely et al. |
| 6,523,416 B2 | 2/2003 | Takagi et al. |
| 6,525,593 B1 | 2/2003 | Mar |
| 6,526,556 B1 | 2/2003 | Stoica et al. |
| 6,529,791 B1 | 3/2003 | Takagi |
| 6,530,065 B1 | 3/2003 | McDonald et al. |
| 6,530,072 B1 | 3/2003 | Hagerman et al. |
| 6,534,970 B1 | 3/2003 | Ely et al. |
| 6,535,061 B2 | 3/2003 | Darmawaskita et al. |
| 6,535,200 B2 | 3/2003 | Philipp |
| 6,535,946 B1 | 3/2003 | Bryant et al. |
| 6,536,028 B1 | 3/2003 | Katsioulas et al. |
| 6,539,534 B1 | 3/2003 | Bennett |
| 6,542,025 B1 | 4/2003 | Kutz et al. |
| 6,542,844 B1 | 4/2003 | Hanna |
| 6,542,845 B1 | 4/2003 | Grucci et al. |
| 6,552,933 B2 | 4/2003 | Roohparvar |
| 6,553,057 B1 | 4/2003 | Sha et al. |
| 6,554,469 B1 | 4/2003 | Thomson et al. |
| 6,556,044 B2 | 4/2003 | Langhammer et al. |
| 6,557,164 B1 | 4/2003 | Faustini |
| 6,559,685 B2 | 5/2003 | Green |
| 6,560,306 B1 | 5/2003 | Duffy et al. |
| 6,560,699 B1 | 5/2003 | Konkle |
| 6,563,391 B1 | 5/2003 | Mar |

(56) References Cited

U.S. PATENT DOCUMENTS

| | | |
|---|---|---|
| 6,564,179 B1 | 5/2003 | Belhaj |
| 6,566,961 B2 | 5/2003 | Dasgupta et al. |
| 6,567,426 B1 | 5/2003 | van Hook et al. |
| 6,567,932 B2 | 5/2003 | Edwards et al. |
| 6,570,557 B1 | 5/2003 | Westerman et al. |
| 6,571,331 B2 | 5/2003 | Henry et al. |
| 6,571,373 B1 | 5/2003 | Devins et al. |
| 6,574,590 B1 | 6/2003 | Kershaw et al. |
| 6,574,739 B1 | 6/2003 | Kung et al. |
| 6,575,373 B1 | 6/2003 | Nakano |
| 6,577,258 B2 | 6/2003 | Ruha et al. |
| 6,578,174 B2 | 6/2003 | Zizzo |
| 6,580,329 B2 | 6/2003 | Sander |
| 6,581,191 B1 | 6/2003 | Schubert et al. |
| 6,587,093 B1 | 7/2003 | Shaw et al. |
| 6,587,995 B1 | 7/2003 | Duboc et al. |
| 6,588,004 B1 | 7/2003 | Southgate et al. |
| 6,590,422 B1 | 7/2003 | Dillon |
| 6,590,517 B1 | 7/2003 | Swanson |
| 6,590,589 B1 | 7/2003 | Sluiman et al. |
| 6,591,369 B1 | 7/2003 | Edwards et al. |
| 6,592,626 B1 | 7/2003 | Bauchot et al. |
| 6,594,796 B1 | 7/2003 | Chiang |
| 6,594,799 B1 | 7/2003 | Robertson et al. |
| 6,597,212 B1 | 7/2003 | Wang et al. |
| 6,597,824 B2 | 7/2003 | Newberg et al. |
| 6,598,178 B1 | 7/2003 | Yee et al. |
| 6,600,346 B1 | 7/2003 | Macaluso |
| 6,600,351 B2 | 7/2003 | Bisanti et al. |
| 6,600,575 B1 | 7/2003 | Kohara |
| 6,601,189 B1 | 7/2003 | Edwards et al. |
| 6,601,236 B1 | 7/2003 | Curtis |
| 6,603,330 B1 | 8/2003 | Snyder |
| 6,603,348 B1 | 8/2003 | Preuss et al. |
| 6,604,179 B2 | 8/2003 | Volk et al. |
| 6,606,731 B1 | 8/2003 | Baum et al. |
| 6,608,472 B1 | 8/2003 | Kutz et al. |
| 6,610,936 B2 | 8/2003 | Gillespie et al. |
| 6,611,220 B1 | 8/2003 | Snyder |
| 6,611,276 B1 | 8/2003 | Muratori et al. |
| 6,611,856 B1 | 8/2003 | Liao et al. |
| 6,611,952 B1 | 8/2003 | Prakash et al. |
| 6,613,098 B1 | 9/2003 | Sorge et al. |
| 6,614,260 B1 | 9/2003 | Welch et al. |
| 6,614,320 B1 | 9/2003 | Sullam et al. |
| 6,614,374 B1 | 9/2003 | Gustavsson et al. |
| 6,614,458 B1 | 9/2003 | Lambert et al. |
| 6,615,167 B1 | 9/2003 | Devins et al. |
| 6,617,888 B2 | 9/2003 | Volk |
| 6,618,854 B1 | 9/2003 | Mann |
| 6,621,356 B2 | 9/2003 | Gotz et al. |
| 6,624,640 B2 | 9/2003 | Lund et al. |
| 6,625,765 B1 | 9/2003 | Krishnan |
| 6,628,163 B2 | 9/2003 | Dathe et al. |
| 6,628,311 B1 | 9/2003 | Fang |
| 6,631,508 B1 | 10/2003 | Williams |
| 6,634,008 B1 | 10/2003 | Dole |
| 6,634,009 B1 | 10/2003 | Molson et al. |
| 6,636,096 B2 | 10/2003 | Schaffer et al. |
| 6,636,169 B1 | 10/2003 | Distinti et al. |
| 6,637,015 B1 | 10/2003 | Ogami et al. |
| 6,639,586 B2 | 10/2003 | Gerpheide |
| 6,642,857 B1 | 11/2003 | Schediwy et al. |
| 6,643,151 B1 | 11/2003 | Nebrigic et al. |
| 6,643,810 B2 | 11/2003 | Whetsel |
| 6,649,924 B1 | 11/2003 | Philipp et al. |
| 6,650,581 B2 | 11/2003 | Hong et al. |
| 6,658,498 B1 | 12/2003 | Carney et al. |
| 6,658,633 B2 | 12/2003 | Devins et al. |
| 6,661,288 B2 | 12/2003 | Morgan et al. |
| 6,661,410 B2 | 12/2003 | Casebolt et al. |
| 6,661,724 B1 | 12/2003 | Snyder et al. |
| 6,664,978 B1 | 12/2003 | Kekic et al. |
| 6,664,991 B1 | 12/2003 | Chew et al. |
| 6,667,642 B1 | 12/2003 | Moyal |
| 6,667,740 B2 | 12/2003 | Ely et al. |
| 6,670,852 B1 | 12/2003 | Hauck |
| 6,673,308 B2 | 1/2004 | Hino et al. |
| 6,677,814 B2 | 1/2004 | Low et al. |
| 6,677,932 B1 | 1/2004 | Westerman |
| 6,678,645 B1 | 1/2004 | Rajsuman et al. |
| 6,678,877 B1 | 1/2004 | Perry et al. |
| 6,680,632 B1 | 1/2004 | Meyers et al. |
| 6,680,731 B2 | 1/2004 | Gerpheide et al. |
| 6,681,280 B1 | 1/2004 | Miyake et al. |
| 6,681,359 B1 | 1/2004 | Au et al. |
| 6,683,462 B2 | 1/2004 | Shimizu |
| 6,683,930 B1 | 1/2004 | Dalmia |
| 6,686,787 B2 | 2/2004 | Ling |
| 6,686,860 B2 | 2/2004 | Gulati et al. |
| 6,690,224 B1 | 2/2004 | Moore |
| 6,691,193 B1 | 2/2004 | Wang et al. |
| 6,691,301 B2 | 2/2004 | Bowen |
| 6,697,754 B1 | 2/2004 | Alexander |
| 6,701,340 B1 | 3/2004 | Gorecki et al. |
| 6,701,487 B1 | 3/2004 | Ogami et al. |
| 6,701,508 B1 | 3/2004 | Bartz et al. |
| 6,703,961 B2 | 3/2004 | Mueck et al. |
| 6,704,381 B1 | 3/2004 | Moyal et al. |
| 6,704,879 B1 | 3/2004 | Parrish |
| 6,704,889 B2 | 3/2004 | Veenstra et al. |
| 6,704,893 B1 | 3/2004 | Bauwens et al. |
| 6,705,511 B1 | 3/2004 | Dames et al. |
| 6,711,226 B1 | 3/2004 | Williams et al. |
| 6,711,731 B2 | 3/2004 | Weiss |
| 6,713,897 B2 | 3/2004 | Caldwell |
| 6,714,066 B2 | 3/2004 | Gorecki et al. |
| 6,714,817 B2 | 3/2004 | Daynes et al. |
| 6,715,132 B1 | 3/2004 | Bartz et al. |
| 6,717,474 B2 | 4/2004 | Chen et al. |
| 6,718,294 B1 | 4/2004 | Bortfeld |
| 6,718,520 B1 | 4/2004 | Merryman et al. |
| 6,718,533 B1 | 4/2004 | Schneider et al. |
| 6,724,220 B1 | 4/2004 | Snyder et al. |
| 6,725,441 B1 | 4/2004 | Keller et al. |
| 6,728,900 B1 | 4/2004 | Meli |
| 6,728,902 B2 | 4/2004 | Kaiser et al. |
| 6,730,863 B1 | 5/2004 | Gerpheide et al. |
| 6,731,552 B2 | 5/2004 | Perner |
| 6,732,068 B2 | 5/2004 | Sample et al. |
| 6,732,347 B1 | 5/2004 | Camilleri et al. |
| 6,738,858 B1 | 5/2004 | Fernald et al. |
| 6,744,323 B1 | 6/2004 | Moyal et al. |
| 6,748,569 B1 | 6/2004 | Brooke et al. |
| 6,750,852 B2 | 6/2004 | Gillespie et al. |
| 6,750,876 B1 | 6/2004 | Atsatt et al. |
| 6,750,889 B1 | 6/2004 | Livingston |
| 6,754,101 B2 | 6/2004 | Terzioglu et al. |
| 6,754,723 B2 | 6/2004 | Kato |
| 6,754,765 B1 | 6/2004 | Chang et al. |
| 6,754,849 B2 | 6/2004 | Tamura |
| 6,757,882 B2 | 6/2004 | Chen et al. |
| 6,765,407 B1 | 7/2004 | Snyder |
| 6,768,337 B2 | 7/2004 | Kohno et al. |
| 6,768,352 B1 | 7/2004 | Maher et al. |
| 6,769,622 B1 | 8/2004 | Tournemille et al. |
| 6,771,552 B2 | 8/2004 | Fujisawa |
| 6,774,644 B2 | 8/2004 | Eberlein |
| 6,781,456 B2 | 8/2004 | Pradhan |
| 6,782,068 B1 | 8/2004 | Wilson et al. |
| 6,784,821 B1 | 8/2004 | Lee |
| 6,784,903 B2 * | 8/2004 | Kodosky .................. G06F 8/34 714/E11.171 |
| 6,785,881 B1 | 8/2004 | Bartz et al. |
| 6,788,116 B1 | 9/2004 | Cook et al. |
| 6,788,221 B1 | 9/2004 | Ely et al. |
| 6,788,521 B1 | 9/2004 | Nishi |
| 6,791,377 B2 | 9/2004 | Ilchmann et al. |
| 6,792,584 B1 | 9/2004 | Eneboe et al. |
| 6,798,218 B2 | 9/2004 | Kasperkovitz |
| 6,798,299 B1 | 9/2004 | Mar et al. |
| 6,799,198 B1 | 9/2004 | Huboi et al. |
| 6,806,771 B1 | 10/2004 | Hildebrant et al. |
| 6,806,782 B2 | 10/2004 | Motoyoshi et al. |

(56) References Cited

U.S. PATENT DOCUMENTS

| | | |
|---|---|---|
| 6,809,275 B1 | 10/2004 | Cheng et al. |
| 6,809,566 B1 | 10/2004 | Xin-Leblanc |
| 6,810,442 B1 | 10/2004 | Lin et al. |
| 6,815,979 B2 | 11/2004 | Ooshita |
| 6,816,544 B1 | 11/2004 | Bailey et al. |
| 6,817,005 B2 | 11/2004 | Mason et al. |
| 6,819,142 B2 | 11/2004 | Viehmann et al. |
| 6,823,282 B1 | 11/2004 | Snyder |
| 6,823,497 B2 | 11/2004 | Schubert et al. |
| 6,825,689 B1 | 11/2004 | Snyder |
| 6,825,869 B2 | 11/2004 | Bang |
| 6,828,824 B2 | 12/2004 | Betz et al. |
| 6,829,727 B1 | 12/2004 | Pawloski |
| 6,834,384 B2 | 12/2004 | Fiorella, II et al. |
| 6,836,169 B2 | 12/2004 | Richmond et al. |
| 6,839,774 B1 | 1/2005 | Ahn et al. |
| 6,842,710 B1 | 1/2005 | Gehring et al. |
| 6,847,203 B1 | 1/2005 | Conti et al. |
| 6,850,117 B2 | 2/2005 | Weber et al. |
| 6,850,554 B1 | 2/2005 | Sha et al. |
| 6,853,598 B2 | 2/2005 | Chevallier |
| 6,854,067 B1 | 2/2005 | Kutz et al. |
| 6,856,433 B2 | 2/2005 | Hatano et al. |
| 6,859,884 B1 | 2/2005 | Sullam |
| 6,862,240 B2 | 3/2005 | Burgan |
| 6,864,710 B1 | 3/2005 | Lacey et al. |
| 6,865,429 B1 | 3/2005 | Schneider et al. |
| 6,865,504 B2 | 3/2005 | Larson et al. |
| 6,868,500 B1 | 3/2005 | Kutz et al. |
| 6,871,253 B2 | 3/2005 | Greeff et al. |
| 6,871,331 B1 | 3/2005 | Bloom et al. |
| 6,873,203 B1 | 3/2005 | Paul et al. |
| 6,873,210 B2 | 3/2005 | Mulder et al. |
| 6,876,941 B2 | 4/2005 | Nightingale |
| 6,880,086 B2 | 4/2005 | Kidder et al. |
| 6,888,453 B2 | 5/2005 | Lutz et al. |
| 6,888,538 B2 | 5/2005 | Ely et al. |
| 6,892,310 B1 | 5/2005 | Kutz et al. |
| 6,892,322 B1 | 5/2005 | Snyder |
| 6,893,724 B2 | 5/2005 | Lin et al. |
| 6,894,928 B2 | 5/2005 | Owen |
| 6,897,390 B2 | 5/2005 | Caldwell et al. |
| 6,898,703 B1 | 5/2005 | Ogami et al. |
| 6,900,663 B1 | 5/2005 | Roper et al. |
| 6,901,563 B1 | 5/2005 | Ogami et al. |
| 6,903,402 B2 | 6/2005 | Miyazawa |
| 6,903,613 B1 | 6/2005 | Mitchell et al. |
| 6,904,570 B2 | 6/2005 | Foote et al. |
| 6,910,126 B1 | 6/2005 | Mar et al. |
| 6,911,857 B1 | 6/2005 | Stiff |
| 6,917,661 B1 | 7/2005 | Scott et al. |
| 6,922,821 B1 | 7/2005 | Nemecek |
| 6,924,668 B2 | 8/2005 | Mueller et al. |
| 6,934,674 B1 | 8/2005 | Douezy et al. |
| 6,937,075 B2 | 8/2005 | Lim et al. |
| 6,940,356 B2 | 9/2005 | Mcdonald, II et al. |
| 6,941,336 B1 | 9/2005 | Mar |
| 6,941,538 B2 | 9/2005 | Hwang et al. |
| 6,944,018 B2 | 9/2005 | Caldwell |
| 6,949,811 B2 | 9/2005 | Miyazawa |
| 6,949,984 B2 | 9/2005 | Siniscalchi |
| 6,950,954 B1 | 9/2005 | Sullam et al. |
| 6,950,990 B2 | 9/2005 | Rajarajan et al. |
| 6,952,778 B1 | 10/2005 | Snyder |
| 6,954,511 B2 | 10/2005 | Tachimori |
| 6,954,904 B2 | 10/2005 | White |
| 6,956,419 B1 | 10/2005 | Mann et al. |
| 6,957,180 B1 | 10/2005 | Nemecek |
| 6,957,242 B1 | 10/2005 | Snyder |
| 6,963,233 B2 | 11/2005 | Puccio et al. |
| 6,963,908 B1 | 11/2005 | Lynch et al. |
| 6,966,039 B1 | 11/2005 | Bartz et al. |
| 6,967,511 B1 | 11/2005 | Sullam |
| 6,967,960 B1 | 11/2005 | Bross et al. |
| 6,968,346 B2 | 11/2005 | Hekmatpour |
| 6,969,978 B2 | 11/2005 | Dening |
| 6,970,844 B1 | 11/2005 | Bierenbaum |
| 6,971,004 B1 | 11/2005 | Pleis et al. |
| 6,973,400 B2 | 12/2005 | Cahill-O'Brien et al. |
| 6,975,123 B1 | 12/2005 | Malang et al. |
| 6,980,060 B2 | 12/2005 | Boerstler et al. |
| 6,981,090 B1 | 12/2005 | Kutz et al. |
| 6,988,192 B2 | 1/2006 | Snider |
| 6,996,799 B1 | 2/2006 | Cismas et al. |
| 7,005,933 B1 | 2/2006 | Shutt |
| 7,009,444 B1 | 3/2006 | Scott |
| 7,010,773 B1 | 3/2006 | Bartz et al. |
| 7,015,735 B2 | 3/2006 | Kimura et al. |
| 7,017,145 B2 | 3/2006 | Taylor |
| 7,017,409 B2 | 3/2006 | Zielinski et al. |
| 7,020,854 B2 | 3/2006 | Killian et al. |
| 7,023,215 B2 | 4/2006 | Steenwyk |
| 7,023,257 B1 | 4/2006 | Sullam |
| 7,024,636 B2 | 4/2006 | Weed |
| 7,024,654 B2 | 4/2006 | Bersch et al. |
| 7,026,861 B2 | 4/2006 | Steenwyk |
| 7,030,513 B2 | 4/2006 | Caldwell |
| 7,030,656 B2 | 4/2006 | Lo et al. |
| 7,030,688 B2 | 4/2006 | Dosho et al. |
| 7,030,782 B2 | 4/2006 | Ely et al. |
| 7,034,603 B2 | 4/2006 | Brady et al. |
| 7,042,301 B2 | 5/2006 | Sutardja |
| 7,047,166 B2 | 5/2006 | Dancea |
| 7,055,035 B2 | 5/2006 | Allison et al. |
| 7,058,921 B1 | 6/2006 | Hwang et al. |
| 7,073,158 B2 | 7/2006 | Mccubbrey |
| 7,076,420 B1 | 7/2006 | Snyder et al. |
| 7,079,166 B1 | 7/2006 | Hong |
| 7,086,014 B1 | 8/2006 | Bartz et al. |
| 7,088,166 B1 | 8/2006 | Reinschmidt et al. |
| 7,089,175 B1 | 8/2006 | Nemecek et al. |
| 7,091,713 B2 | 8/2006 | Erdelyi et al. |
| 7,092,980 B1 | 8/2006 | Mar et al. |
| 7,098,414 B2 | 8/2006 | Caldwell |
| 7,099,818 B1 | 8/2006 | Nemecek et al. |
| 7,103,108 B1 | 9/2006 | Beard |
| 7,109,978 B2 | 9/2006 | Gillespie et al. |
| 7,117,485 B2 | 10/2006 | Wilkinson et al. |
| 7,119,550 B2 | 10/2006 | Kitano et al. |
| 7,119,602 B2 | 10/2006 | Davis |
| 7,124,376 B2 | 10/2006 | Zaidi et al. |
| 7,127,630 B1 | 10/2006 | Snyder |
| 7,129,793 B2 | 10/2006 | Gramegna |
| 7,129,873 B2 | 10/2006 | Kawamura |
| 7,132,835 B1 | 11/2006 | Arcus |
| 7,133,140 B2 | 11/2006 | Lukacs et al. |
| 7,133,793 B2 | 11/2006 | Ely et al. |
| 7,138,841 B1 | 11/2006 | Li et al. |
| 7,138,868 B2 | 11/2006 | Sanchez et al. |
| 7,139,530 B2 | 11/2006 | Kusbel |
| 7,141,968 B2 | 11/2006 | Hibbs et al. |
| 7,141,987 B2 | 11/2006 | Hibbs et al. |
| 7,149,316 B1 | 12/2006 | Kutz et al. |
| 7,150,002 B1 | 12/2006 | Anderson et al. |
| 7,151,528 B2 | 12/2006 | Taylor et al. |
| 7,152,027 B2 | 12/2006 | Andrade et al. |
| 7,154,294 B2 | 12/2006 | Liu et al. |
| 7,161,936 B1 | 1/2007 | Barrass et al. |
| 7,162,410 B1 | 1/2007 | Nemecek et al. |
| 7,171,455 B1 | 1/2007 | Gupta et al. |
| 7,176,701 B2 | 2/2007 | Wachi et al. |
| 7,178,096 B2 | 2/2007 | Rangan et al. |
| 7,180,342 B1 | 2/2007 | Shutt et al. |
| 7,185,162 B1 | 2/2007 | Snyder |
| 7,185,321 B1 | 2/2007 | Roe et al. |
| 7,188,063 B1 | 3/2007 | Snyder |
| 7,193,901 B2 | 3/2007 | Ruby et al. |
| 7,200,507 B2 | 4/2007 | Chen et al. |
| 7,206,733 B1 | 4/2007 | Nemecek |
| 7,212,189 B2 | 5/2007 | Shaw et al. |
| 7,221,187 B1 | 5/2007 | Snyder et al. |
| 7,227,389 B2 | 6/2007 | Gong et al. |
| 7,236,921 B1 | 6/2007 | Nemecek et al. |
| 7,250,825 B2 | 7/2007 | Wilson et al. |

(56) References Cited

U.S. PATENT DOCUMENTS

| | | |
|---|---|---|
| 7,256,588 B2 | 8/2007 | Howard et al. |
| 7,265,633 B1 | 9/2007 | Stiff |
| 7,266,768 B2 | 9/2007 | Ferlitsch et al. |
| 7,281,846 B2 | 10/2007 | Mcleod |
| 7,282,905 B2 | 10/2007 | Chen et al. |
| 7,283,151 B2 | 10/2007 | Nihei et al. |
| 7,287,112 B1 | 10/2007 | Pleis et al. |
| 7,288,977 B2 | 10/2007 | Stanley |
| 7,290,244 B2 | 10/2007 | Peck et al. |
| 7,295,049 B1 | 11/2007 | Moyal et al. |
| 7,298,124 B2 | 11/2007 | Kan et al. |
| 7,301,835 B2 | 11/2007 | Joshi et al. |
| 7,305,510 B2 | 12/2007 | Miller |
| 7,307,485 B1 | 12/2007 | Snyder et al. |
| 7,308,608 B1 | 12/2007 | Pleis et al. |
| 7,312,616 B2 | 12/2007 | Snyder |
| 7,323,879 B2 | 1/2008 | Kuo et al. |
| 7,324,380 B2 | 1/2008 | Negut et al. |
| 7,332,976 B1 | 2/2008 | Brennan |
| 7,342,405 B2 | 3/2008 | Eldridge et al. |
| 7,358,714 B2 | 4/2008 | Watanabe et al. |
| 7,367,017 B2 | 4/2008 | Maddocks et al. |
| 7,373,437 B2 | 5/2008 | Seigneret et al. |
| 7,376,001 B2 | 5/2008 | Joshi et al. |
| 7,376,904 B2 | 5/2008 | Cifra et al. |
| 7,386,740 B2 | 6/2008 | Kutz et al. |
| 7,392,011 B1 | 6/2008 | Jacomb-Hood |
| 7,400,183 B1 | 7/2008 | Sivadasan et al. |
| 7,406,674 B1 | 7/2008 | Ogami et al. |
| 7,421,251 B2 | 9/2008 | Westwick et al. |
| 7,461,274 B2 | 12/2008 | Merkin |
| 7,466,307 B2 | 12/2008 | Trent, Jr. et al. |
| 7,542,533 B2 | 6/2009 | Jasa et al. |
| 7,554,847 B2 | 6/2009 | Lee |
| 7,616,509 B2 | 11/2009 | Qureshi et al. |
| 8,042,093 B1 | 10/2011 | Ogami |
| 8,069,428 B1 | 11/2011 | Ogami et al. |
| 8,176,296 B2 | 5/2012 | Snyder |
| 8,793,635 B1 | 7/2014 | Ogami et al. |
| 2001/0002129 A1 | 5/2001 | Zimmerman et al. |
| 2001/0010083 A1 | 7/2001 | Satoh |
| 2001/0038392 A1 | 11/2001 | Humpleman et al. |
| 2001/0043081 A1 | 11/2001 | Rees |
| 2001/0044927 A1 | 11/2001 | Kamiewicz |
| 2001/0045861 A1 | 11/2001 | Bloodworth et al. |
| 2001/0047509 A1 | 11/2001 | Mason et al. |
| 2002/0007467 A1 | 1/2002 | Ma et al. |
| 2002/0010716 A1 | 1/2002 | Mccartney et al. |
| 2002/0016706 A1 | 2/2002 | Cooke et al. |
| 2002/0023110 A1 | 2/2002 | Fortin et al. |
| 2002/0042696 A1 | 4/2002 | Garcia et al. |
| 2002/0052729 A1 | 5/2002 | Kyung et al. |
| 2002/0059543 A1 | 5/2002 | Cheng et al. |
| 2002/0063688 A1 | 5/2002 | Shaw et al. |
| 2002/0065646 A1 | 5/2002 | Waldie et al. |
| 2002/0068989 A1 | 6/2002 | Ebisawa et al. |
| 2002/0073119 A1 | 6/2002 | Richard |
| 2002/0073380 A1 | 6/2002 | Cooke |
| 2002/0080186 A1 | 6/2002 | Frederiksen |
| 2002/0085020 A1 | 7/2002 | Carroll |
| 2002/0099863 A1 | 7/2002 | Comeau et al. |
| 2002/0108006 A1 | 8/2002 | Snyder |
| 2002/0109722 A1 | 8/2002 | Rogers et al. |
| 2002/0116168 A1 | 8/2002 | Kim |
| 2002/0121679 A1 | 9/2002 | Bazarjani et al. |
| 2002/0122060 A1 | 9/2002 | Markel |
| 2002/0129334 A1 | 9/2002 | Dane et al. |
| 2002/0133771 A1 | 9/2002 | Barnett |
| 2002/0133794 A1 | 9/2002 | Kanapathippillai et al. |
| 2002/0138516 A1 | 9/2002 | Igra |
| 2002/0144099 A1 | 10/2002 | Muro et al. |
| 2002/0145433 A1 | 10/2002 | Morrise et al. |
| 2002/0152234 A1 | 10/2002 | Estrada et al. |
| 2002/0152449 A1 | 10/2002 | Lin |
| 2002/0156885 A1 | 10/2002 | Thakkar |
| 2002/0156998 A1 | 10/2002 | Casselman |
| 2002/0161802 A1 | 10/2002 | Gabrick et al. |
| 2002/0166100 A1 | 11/2002 | Meding |
| 2002/0174134 A1 | 11/2002 | Goykhman |
| 2002/0174411 A1 | 11/2002 | Feng et al. |
| 2002/0191029 A1 | 12/2002 | Gillespie et al. |
| 2003/0011639 A1 | 1/2003 | Webb |
| 2003/0014447 A1 | 1/2003 | White |
| 2003/0025734 A1 | 2/2003 | Boose et al. |
| 2003/0033588 A1 | 2/2003 | Alexander |
| 2003/0041235 A1 | 2/2003 | Meyer |
| 2003/0056071 A1 | 3/2003 | Triece et al. |
| 2003/0058469 A1 | 3/2003 | Buis et al. |
| 2003/0061409 A1 | 3/2003 | Rudusky |
| 2003/0061572 A1 | 3/2003 | McClannahan et al. |
| 2003/0062889 A1 | 4/2003 | Ely et al. |
| 2003/0066057 A1 | 4/2003 | RuDusky |
| 2003/0080755 A1 | 5/2003 | Kobayashi |
| 2003/0086300 A1 | 5/2003 | Noyes et al. |
| 2003/0097640 A1 | 5/2003 | Abrams et al. |
| 2003/0105620 A1 | 6/2003 | Bowen |
| 2003/0126947 A1 | 7/2003 | Margaria |
| 2003/0135842 A1 | 7/2003 | Frey et al. |
| 2003/0149961 A1 | 8/2003 | Kawai et al. |
| 2003/0229482 A1 | 12/2003 | Cook et al. |
| 2004/0018711 A1 | 1/2004 | Madurawe |
| 2004/0054821 A1 | 3/2004 | Warren et al. |
| 2004/0153802 A1 | 8/2004 | Kudo et al. |
| 2004/0205553 A1 | 10/2004 | Hall et al. |
| 2004/0205617 A1 | 10/2004 | Light |
| 2004/0205695 A1 | 10/2004 | Fletcher |
| 2005/0024341 A1 | 2/2005 | Gillespie et al. |
| 2005/0066152 A1 | 3/2005 | Garey |
| 2005/0143968 A9 | 6/2005 | Odom et al. |
| 2005/0240917 A1 | 10/2005 | Wu |
| 2005/0248534 A1 | 11/2005 | Kehlstadt |
| 2005/0280453 A1 | 12/2005 | Hsieh |
| 2006/0015862 A1 | 1/2006 | Odom et al. |
| 2006/0031768 A1 | 2/2006 | Shah et al. |
| 2006/0032680 A1 | 2/2006 | Elias et al. |
| 2006/0097991 A1 | 5/2006 | Hotelling et al. |
| 2006/0273804 A1 | 12/2006 | Delorme et al. |
| 2007/0139074 A1 | 6/2007 | Reblewski |
| 2007/0258458 A1 | 11/2007 | Kapoor |
| 2008/0095213 A1 | 4/2008 | Lin et al. |
| 2008/0186052 A1 | 8/2008 | Needham et al. |
| 2008/0259998 A1 | 10/2008 | Venkataraman et al. |
| 2008/0294806 A1 | 11/2008 | Swindle et al. |
| 2009/0066427 A1 | 3/2009 | Brennan |
| 2009/0322305 A1 | 12/2009 | De |

FOREIGN PATENT DOCUMENTS

| | | |
|---|---|---|
| EP | 368398 A1 | 5/1990 |
| EP | 0450863 A | 10/1991 |
| EP | 0499383 A | 8/1992 |
| EP | 0639816 A2 | 2/1995 |
| EP | 1170671 A | 1/2002 |
| EP | 1191423 A | 3/2002 |
| EP | 1205848 A1 | 5/2002 |
| JP | 405055842 A1 | 3/1993 |
| JP | 06021732 A1 | 1/1994 |
| JP | 404095408 A1 | 3/2002 |
| JP | 4083405 B2 | 4/2008 |
| WO | 9532478 A | 11/1995 |
| WO | 9617305 A | 6/1996 |
| WO | 9834376 A2 | 8/1998 |
| WO | 9909712 A | 2/1999 |

OTHER PUBLICATIONS

"Electronic Circuit Protector-Circuit Breaker," IBM Technical Disclosure Bulletin; vol. 36, Issue 8, Aug. 1, 1993; 1 page.

"Microsoft Files Summary Judgement Motions"; Feb. 1999; Microsoft PressPass; retrieved on May 20, 2005 from http://www.microsoft.com/presspass/press/1999/feb99/Feb99/Calderapr.asp; 3 pages.

(56) References Cited

OTHER PUBLICATIONS

"New Object Domain R3 Beta Now Available (Build 134)!" Mar. 13, 2001; http://web.archive.org/web/200100331202605/www.objectdomain.com/domain30/index.html; 2 pages.
"OMG XML Metadata Interchange (XMI) Specifications" 2000; 17 pages.
"PSoC Designer: Integrated Development Environment User Guide"; Jul. 17, 2001; Cypress MicroSystems; Revision 1.11; all pages.
"PSoC designer: Integrated development environment, getting started 25-minute tutorial, version 1.0," Cypress Microsystems., Cypress Microsystems, Inc. CMS10006A, Jul. 3, 2001; 25 pages.
"PSoC technology complete changes 8-bit MCU system design", Cypress Microsystems, Inc. retrieved from <http>://www.archive.org/web/20010219005250/http://cypressmicro.com-/t . . . >, Feb. 19, 2001; 21 pages.
"Webster's Third New International Dictionary," 1996, G. & C. Merriam Company; 3 pages (including pp. 1328-1329).
A.F. Harvey, "DMA Fundamentals on Various PC Platforms," 2001, 2004, National Instruments Corporation, pp. 1-19; 19 pages.
Adham et al., "Preliminary Outline of the IEEE P1500 Scalable Architecture for Testing Embedded Cores," 1999, IEEE; 6 pages.
Andrew S. Tanenbaum with contributions from James R. Goodman, "Structured Computer Organization," 1999, Prentice Hall, Fourth Edition; 32 pages.
Andrews, "Roadmap for Extending IEEE 1149.1 for Hierarchical Control of Locally-Stored, Standardized command Set, Test Programs," IEEE, 1994; 7 pages.
Anonymous, "F/Port:Fast Parallel Port for the PC" Installation Manual Release 7.1, circa 1997, available for download from http://www.fapo.com/fport.htm; 25 pages.
Anonymous, "JEEN JTAG Embedded Ice Ethernet Interface," Aug. 1999, Embedded Performance, Inc.; 3 pages.
Anonymous, "Lotus Notes FAQ—How do you generate unique document numbers?" Sep. 19, 1999; retrieved from www.keysolutions.com on Jul. 9, 2008; 1 page.
Anonymous, "Warp Nine Engineering—The IEEE 1284 Experts-F/Port Product Sheet," undated web page found at http://www.fapo.com/fport.htm; printed on Apr. 12, 2005; 2 pages.
Anonymous; "Using Debug"; 1999; Prentice-Hall Publishing; 20 pages.
U.S. Appl. No. 14/445,364: "Techniques for Generating Microcontroller Configuration Information," Kenneth Y. Ogami et al., filed Jul. 29, 2014; 48 pages.
Ashok Bindra, "Programmable SoC Delivers a New Level of System Flexibility"; Electronic Design; Nov. 6, 2000; 11 pages.
Atmel Corporation: AT9OSC Summary: "Secure Microcontrollers for Smart Cards," Oct. 1999; 7 pages.
Azim et al., "A Custom DSP Chip to Implement a Robot Motion Controller Proceedings of the IEEE Custom Integrated Circuits Conference," May 1988, pp. 8.7.1-8.7.5; 6 pages.
Bakker et al., "Micropower CMOS Temperature Sensor with Digital Output," IEEE Journal of Solid-State Circuits, Jul. 1996; 3 pages.
Bauer et al.; "A Reconfigurable Logic Machine for Fast Event-Driven Simulation"; Jun. 1998; Design Automation Conference Proceedings; 8 pages.
Burogs et al., "Power Converter Analysis and Design using Matlab: A Transfer Function Approach," Proceedings of IEEE International Symposium on Industrial Electronics 1998, vol. 2, pp. 552-557; 6 pages.
Bursky, "FPGA Combines Multiple Interfaces and Logic," Electronic Design, vol. 48 No. 20, Oct. 2, 2000, pp. 74-78; 5 pages.
Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.
Chapweske, Adam; "The PS/2 Mouse Interface," PS/2 Mouse Interfacing, 2001, retrieved on May 18, 2006; 10 pages.
Charles Melear, "Using Background Modes for Testing, Debugging and Emulation of Microcontrollers," IEEE, 1997, pp. 90-97; 8 pages.

Charles, Jr. et al., "Wirebonding: Reinventing the Process for MCMs," Apr. 1998, IEEE 7th International Conference on Multichip Modules and High Density Packaging, pp. 300-302; 3 pages.
Ching et al., "An In-Curcuit-Emulator for TMS320C25," IEEE, 1994, pp. 51-56; 6 pages.
Cover Pages Technology Reports; XML and Electronic Design Automation (EDA); Aug. 2000; retrieved from http://xml.coverpages.org on Mar. 23, 2005; 5 pages.
Cypress MicroSystems, Inc. "Cypress MicroSystems Unveils Programmable System-On-A-Chip for Embedded Internet, Communications, and Consumer Systems" Nov. 13, 2000; 3 pages.
Dahl et al., "Emulation of the Sparcle Microprocessor with the MIT Virtual Wires Emulation System," 1994, IEEE, pp. 14-22; 9 pages.
Durham et al., "Circuit Architectures for High Linearity Monolithic Continuous-Time Filtering," IEEE, 1992; 7 pages.
Durham et al., "High-Linearity Conitnuous-Time Filter in 5-V VLSI CMOS," IEEE, 1992; 8 pages.
Durham et al., "Integrated Continuous-Time Balanced Filters for 16-bit DSP Interfaces," IEEE, 1993; 6 pages.
Duvvuru et al., "Evaluation of a Branch Target Address Cache," 1995, IEEE, pp. 173-180; 8 pages.
Ebeling et al., "Validating VLSI Circuit Layout by Wirelist Comparison," Sep. 1983, In the Proceedings of the IEEE International Conference on Computer Aided Design (ICCAD-83), pp. 172-173; 2 pages.
Ebling, "Gemini II: A Second Generation Layout Validation Program;" 1988; in proceedings of the IEEE International Conference on Computer Aided Design (ICCAD-88); 4 pages.
Electronic Tools Company; E-Studio User Manuel; 2000; retrieved from http://web.archive.org for site http://e-tools.com on Mar. 23, 2005; 77 pages.
Frank Goodenough, "Analog Counterparts of FPGAS Ease System Design," Electronic Design, Penton Publishing, Cleveland, OH, Oct. 14, 1994, vol. 42, No. 21, pp. 63-66, 68; 10 pages.
Ganapathy et al., "Hardware Emulation for Functional Verification of K5", Jun. 1996, 33rd Design Automation Conference Proceedings, Jun. 3-7, 1996, pp. 315-318; 4 pages.
Ghosh et al., "A Low Overhead Design for Testability and Test Generation Technique for Core-based Systems," IEEE, 1997; 10 pages.
Haberl et al., "Self Testable Boards with Standard IEEE 1149.5 Module Test and Maintenance (MTM) Bus Interface," IEEE, 1994; 6 pages.
Hamblen, "Rapid Prototyping Using Field-Programmable Logic Devices" Jun. 2000, IEEE; 9 pages.
Harbaum et al. "Design of a Flexible Coprocessor Unit" Proceedings of the Euromicro Conference, XX XX, Sep. 1999, pp. 335-342; 10 pages.
Harrison et al.; "Xilinx FPGA Design in a Group Environment Using VHDS and Synthesis Tools"; Colloquium on Digital System Design Using Synthesis Techniques; Feb. 15, 1996; 4 pages.
Hintz et al., "Microcontrollers," 1992, McGraw-Hill, pp. 29-37; 11 pages.
Hong et al., "An FPGA-Based Hardware Emulator for Fast Fault Emulation," IEEE, 1997, pp. 345-348; 4 pages.
USPTO Non-Final Rejection for U.S. Appl. No. 14/445,364 dated Feb. 1, 2018; 11 pages.
Hong et al., "Hierarchial System Test by an IEEE 1149.5 MTM-Bus Slave-Module Interface Core," IEEE, 2000; 14 pages.
Hsieh et al., "Modeling Micro-Controller Peripherals for High-Level Co-Simulation and Synthesis," IEEE, 1997, pp. 127-130; 4 pages.
Huang et al., "Iceberg: An Embedded In-Circuit Emulator Synthesizer for Microcontrollers", Proceedings of the 36th Design Automation Conference, Jun. 1999, pp. 580-585; 6 pages.
International Search Report and Written Opinion of the International Searching Authority for PCT/US05/28898, filed Aug. 12, 2005, dated Mar. 6, 2007; 6 pages.
Ito et al., "A Comparison of Microcontrollers Targeted to FPGA-Based Embedded Applications", Sep. 2000, Proceedings of 13th Symposium on Integrated Circuits and Systems Design, Sep. 18-24, 2000, pp. 397-402; 6 pages.

(56) References Cited

OTHER PUBLICATIONS

Jonathan B. Rosenburg, "How Debuggers Work" John Wiley & Sons, Inc. 1996; 259 pages.
Julio Faura et al.; "A Novel Mixed Signal Programmable Device With On-Chip Microprocessor", 1997, IEEE 1997 Custom Integrated Circuits Conference, pp. 103-106; 4 pages.
Jung et al., "A Register File with Transposed Access Mode," 2000, IEEE; 2 pages.
Karayiannis et al., "Using XML for Representation and Visualization of Elaborated VHDL-AMS Models," Oct. 2000, IEEE, VHDL International Users Forum Fall Workshop, Proceedings, pp. 83-87.
Khan et al.; "FPGA Architectures for Asic Hardware Emulators"; IEEE 1993, pp. 336-340; 5 pages.
Kory Hopkins, "Definition;" Jan. 16, 1997; <http://www.cs.sfu.ca/cs/people/GradStudent.html>; 1 page.
Larsson, "A 2-1600-MHz CMOS Clock Recovery PLL with Low-Vdd Capability," IEEE Journal of Solid-State Circuits, vol. 34, No. 12, Dec. 1999; 10 pages.
M. Mooris Mano, "Computer System Architecture," 1982, Prentice-Hall, 2nd Edition, pp. 261-264 and 435-440; 14 pages.
Maneatis, "Low-Jitter Process-Independent DLL and PLL Based on Self-Biased Techniques," IEEE Journal of Solid-State Circuits, vol. 31, No. 11, Nov. 1996, pp. 1723-1732; 10 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, vol. 45 No. 3, Feb. 3, 2000, pp. 129-138; 7 pages.
Microsoft Press Computer User's Dictionary; 1998; 3 pages (including p. 18).
Morrison, Gale, "IBM Eyes Merchant Packaging Services," Jul. 13, 2998, Electronic News, available at http://www.findarticles.com; 4 pages.
Nam et al., "Fast Development of Source-Level Debugging System Using Hardware Emulation," IEEE, 2000, pp. 400-404; 4 pages.
Nouta et al. "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.
Oh et al., "Emulator Environment Based on an FPGA Prototyping Board," IEEE, Jun. 21-23, 2000, pp. 72-77; 6 pages.
Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages.
Papachristou et al., "Microprocessor Based Testing for Core-Based System on a Chip," IEEE, 1999; 6 pages.
Pastermak et al.; "In-Circuit-Emulation in ASIC Architecture Core Designs," IEEE, 1989, pp. P6-4.1-P6-4.4; 4 pages.
Robert A. Blauschild, "WP 3.5: An Integrated Time Reference," ISSCC94/Session 3, Analog Techniques/Paper WP 3.5, Feb. 1994, pp. 56-58; 4 pages.
Robinson, Gordon D., "Why 1149.1 (JTAG) Really Works", May 1994, Conference Proceedings Electro/94 International, May 10-12, 1994, Combined Volumes, pp. 749-754; 6 pages.
Sedra, Adel S. et al., "Microelectronic Circuits," 3rd Edition, Oxford University Press, pp. xiii-xx and 861-883, 1991; 20 pages.
Snyder et al., "Xilinx's A-to-Z Systems Platform" Cahners Microprocessor, The Insider's Guide to Microprocessor Hardware, Feb. 6, 2001; 9 pages.
Song et al., "A 50% Power Reduction Scheme for CMOS Relaxation Oscillator," IEEE, 1999, pp. 154-157; 4 pages.
Specks et al., "A Mixed Digital-Analog 16B Microcontroller with 0.5MB Flash Memory, On-Chip Power Supply, Physical Newrok Interface, and 40V I/O for Automotive Single-Chip Mechatronics," IEEE, Feb. 9, 2000; 1 page.
Stallman et al.; "Debugging with the GNU Source-Level Debugger"; Jan. 1994; retrieved on May 2, 2005 from http://www.cs.utah.edu; 4 pages.
Stephen Walters, "Computer-Aided Prototyping for ASIC-Based Systems," 1991, IEEE Design & Test of Computers, vol. 8, Issue 2, pp. 4-10; 8 pages.

Texas Instruments, "TXS320C6000 Optimizing Compiler User's Guide," Apr. 2001, Texas Instruments, Chapter 1: pp. 1-7 and Chapter 2: pp. 1-44.
Tran et al., "Fine Pitch and Wirebonding and Reliability of Aluminum Capped Copper Bond Pads," May 2000, IEEE Electronic Components and Technology Conference, pp. 1674-1680; 7 pages.
USPTO Advisory Action for U.S. Appl. No. 11/818,005 dated Jul. 30, 2010; 3 pages.
USPTO Advisory Action for U.S. Appl. No. 14/445,364 dated Nov. 27, 2015; 3 pages.
USPTO Final Rejection for U.S. Appl. No. 10/002,726 dated Mar. 27, 2006; 8 pages.
USPTO Final Rejection for U.S. Appl. No. 10/002,726 dated Nov. 30, 2005; 10 pages.
USPTO Final Rejection for U.S. Appl. No. 11/818,005 dated May 24, 2010; 8 pages.
USPTO Final Rejection for U.S. Appl. No. 14/445,364 dated Sep. 14, 2015; 9 pages.
USPTO Non Final Rejection for U.S. Appl. No. 11/818,005 dated Oct. 26, 2010; 10 pages.
USPTO Non Final Rejection for U.S. Appl. No. 11/818,005 dated Nov. 23, 2009; 8 pages.
USPTO Non-Final Rejection for U.S. Appl. No. 10/002,726 dated Jun. 10, 2005; 10 pages.
USPTO Non-Final Rejection for U.S. Appl. No. 10/002,726 dated Aug. 28, 2006; 10 pages.
USPTO Non-Final Rejection for U.S. Appl. No. 10/002,726 dated Dec. 13, 2004; 7 pages.
USPTO Non-Final Rejection for U.S. Appl. No. 13/305,680 dated Oct. 15, 2012; 8 pages.
USPTO Non-Final Rejection for U.S. Appl. No. 14/445,364 dated Feb. 5, 2016; 11 pages.
USPTO Non-Final Rejection for U.S. Appl. No. 14/445,364 dated Jun. 11, 2015; 10 pages.
USPTO Non-Final Rejection for U.S. Appl. No. 14/445,364 dated Sep. 27, 2016; 8 pages.
USPTO Notice of Allowance for U.S. Appl. No. 10/002,726 dated Feb. 6, 2007; 7 pages.
USPTO Final Rejection for U.S. Appl. No. 14/445,364 dated Jul. 12, 2018; 14 pages.
USPTO Notice of Allowance for U.S. Appl. No. 11/818,005 dated Mar. 23, 2011; 7 pages.
USPTO Notice of Allowance for U.S. Appl. No. 11/818,005 dated Jul. 25, 2011; 7 pages.
USPTO Notice of Allowance for U.S. Appl. No. 13/305,680 dated Feb. 7, 2014; 8 pages.
USPTO Notice of Allowance for U.S. Appl. No. 13/305,680 dated May 19, 2014; 7 pages.
USPTO Notice of Allowance for U.S. Appl. No. 13/305,680 dated Oct. 30, 2013; 10 pages.
USPTO Notice of Allowance for U.S. Appl. No. 14/445,364 dated Feb. 7, 2017; 8 pages.
USPTO Notice of Allowance for U.S. Appl. No. 14/445,364 dated Jun. 9, 2017; 9 pages.
USPTO Notice of Allowance for U.S. Appl. No. 14/445,364 dated Jun. 14, 2016; 8 pages.
USPTO Requirement for Restriction/Election for U.S. Appl. No. 11/818,005 dated Jul. 14, 2009; 5 pages.
Varma et al., "A Structured Test Re-Use Methodology for Core-Based System Chips," IEEE, 1998; 9 pages.
Xerox, "Mesa Debugger Documentation," Apr. 1979; Xerox Systems Development Department; Version 5.0, pp. 1-30; 33 pages.
Yahoo Answers:, "What is the meaning of cascade connection in electrical engineering?" retrieved on Aug. 7, 2015 from https://answers.yahoo.com/question/index?, 1 page.
Yoo et al., "Fast Hardware-Software Coverification by Optimistic Execution of Real Processor, Proceedings of Design, Automation and Test in Europe Conference and Exhibition," Mar. 2000, pp. 663-668; 6 pages.
York et al., "On-chip Support Needed for SOC Debug," Electronic Engineering Times, Jun. 1999, pp. 104, 110; 2 pages.
Zorian et al., "Testing Embedded-Core Based System Chips," IEEE, 1998; 14 pages.

(56) References Cited

OTHER PUBLICATIONS

Zorian, "Test Requirements for Embedded Core-based Systems and IEEE P1500," IEEE, 1997; 9 pages.

* cited by examiner

100

```
        START
          │
          ▼
┌─────────────────────────────────────────┐
│  ACCESS DESCRIPTION OF HARDWARE RESOURCES │
│                  110                      │
└─────────────────────────────────────────┘
          │
          ▼
┌─────────────────────────────────────────┐
│ SELECT AVAILABLE CONFIGURATIONS TO CREATE SELECTED │
│               CONFIGURATION               │
│                  120                      │
└─────────────────────────────────────────┘
          │
          ▼
┌─────────────────────────────────────────┐
│      GENERATE CONFIGURATION INFORMATION   │
│                  130                      │
└─────────────────────────────────────────┘
          │
          ▼
┌─────────────────────────────────────────┐
│ GENERATE MICROPROCESS INSTRUCTIONS TO PRODUCE │
│               CONFIGURATION               │
│                  140                      │
└─────────────────────────────────────────┘
          │
          ▼
┌─────────────────────────────────────────┐
│              GENERATE APIs                │
│                  150                      │
└─────────────────────────────────────────┘
          │
          ▼
┌─────────────────────────────────────────┐
│ GENERATE INTERRUPT VECTOR TABLE CORRESPONDING TO │
│     INTERRUPTS OF SELECTED CONFIGURATION  │
│                  160                      │
└─────────────────────────────────────────┘
          │
          ▼
        FINISH
```

FIGURE 1

```xml
<!--Project DB Ver 0.03 08/10/00-->
<DEVICE_DB>
<USER_MODULE_LIST>
<!--Variable Resolution Incremental ADC-->
<USER_MODULE NAME="ADCEXP" TYPE="PSOC_ADC" HTML="ADCEXP.HTM" ICON="ADC.ico" METAFILE="ADCEXP.emf"
API_PATH TYPE="CUSTOM">
<SHAPESHAPE_TYPE="BLOCKLIST">
<BLOCK_LIST>
<BLOCK NAME="ADC" TYPE="ANALOG_SC">
<REGISTER_LIST>
<REGISTER NAME = "CR0">
<BITFIELD_LIST>
<BITFIELD NAME="OSZ" VALUE="OSZ_32"/>
<BITFIELD NAME="CLOCK_PHASE" VALUE="PHASE_NORM"/>
<BITFIELD NAME="SIGN" VALUE="POS"/>
<BITFIELD NAME="CAP_SIZE" VALUE="16"/>
</BITFIELD_LIST>
</REGISTER>
<REGISTER NAME="CR1">
<BITFIELD_LIST>
<BITFIELD NAME="CAP_SIZE" VALUE="0"/>
</BITFIELD_LIST>
</REGISTER>
<REGISTER NAME="CR2">
<BITFIELD_LIST>
<BITFIELD NAME="A_OUT" VALUE="DISABLED"/>
<BITFIELD NAME="COMP_OUT" VALUE="ENABLED"/>
<BITFIELD NAME="AZ_PHASE" VALUE="AZ_PHI"/>
```

FIGURE 7A

```xml
    <BITFIELD NAME="CAP_SIZE" VALUE="0"/>
   </BITFIELD_LIST>
  </REGISTER>
  <REGISTER NAME="CR3">
   <BITFIELD_LIST>
    <BITFIELD NAME="REF_SELECT" VALUE="COMP"/>
    <BITFIELD NAME="FB_CAP_SELECT" VALUE="PH2_AZ_ENABLE"/>
    <BITFIELD NAME="FB_CAP_GND" VALUE="GND_PHI"/>
    <BITFIELD NAME="SCA_INPUT_MUX_B" VALUE="IN2B"/>
    <BITFIELD NAME="SCB_INPUT_MUX_B" VALUE="IN2B"/>
    <BITFIELD NAME="SBB" VALUE="DISABLE"/>
    <BITFIELD NAME="PWR_SELECT" VALUE="PWR_OFF"/>
   </BITFIELD_LIST>
  </REGISTER>
  <INPUT_LIST/>
 </BLOCK>
</BLOCK_LIST>
<BLOCK_LIST>
 <BLOCK NAME="TMR" TYPE="DIGITAL" INTERRUPT_SOURCE="_TMR_INT" INTERRUPT_TYPE="JUMP">
  <REGISTER_LIST>
```

```
<REGISTER NAME="DIG_BasicFunction">
  <BITFIELD_LIST>
    <BITFIELD NAME="END" VALUE="IsEnd"/>
    <BITFIELD NAME="CompareType" VALUE="LTorEQ"/>
    <BITFIELD NAME="InterruptType" VALUE="TerminalCount"/>
    <BITFIELD NAME="Function" VALUE="Timer"/>
  </BITFIELD_LIST>
</REGISTER>
<REGISTER NAME="DIG_Input">
  <BITFIELD_LIST>
    <BITFIELD NAME="DataSelecvt" VALUE="High"/>
  </BITFIELD_LIST>
</REGISTER>
```

FIGURE 7B (Continued)

```
<REGISTER NAME="DIG_Output">
  <BITFIELD_LIST>
    <BITFIELD NAME="AUXOutputEnable" VALUE="DISABLE"/>
    <BITFIELD NAME="DigOutputEnable" VALUE="DISABLE"/>
  </BITFIELD_LIST>
</REGISTER>
</REGISTER_LIST>
<INPUT_LIST/>
</BLOCK>
</BLOCK_LIST>
</BLOCK_LIST>
<BLOCK NAME="CNT_LSB" TYPE="DIGITAL">
  <REGISTER_LIST>
    <REGISTER NAME="DIG_BasicFunction">
      <BITFIELD_LIST>
        <BITFIELD NAME="Function" VALUE="Counter"/>
        <BITFIELD NAME="CompareType" VALUE="LTorEQ"/>
      </BITFIELD_LIST>
    </REGISTER>
  </REGISTER_LIST>
```

FIGURE 7C

```
<INPUT_LIST>
    <INPUT SOURCE="AnalogOut" TYPE="RESERVED_RESOURCE" REGISTER_NAME="DIG_Input" BITFIELD="DataSelect"/>
</INPUT_LIST>
</BLOCK>
<BLOCK NAME="CNT_MSB" TYPE="DIGITAL" INTERRUPT_SOURCE="_CNT_INT" INTERRUPT_TYPE="JUMP">
<REGISTER_LIST>
<REGISTER NAME="DIG_BasicFunction">
    <BITFIELD_LIST>
        <BITFIELD NAME = "Function" VALUE="Counter"/>
        <BITFIELD NAME = "END" VALUE="IsEnd"/>
        <BITFIELD NAME = "CompareType" VALUE="LTorEQ"/>
    </BITFIELD_LIST>
</REGISTER>
```

FIGURE 7C (Continued)

```
<REGISTER_LIST>
 <INPUT_LIST>
  <INPUT SOURCE="CNT_LSB" TYPE="BLOCK" REGISTER_NAME="DIG_Input" BITFIELD="DataSelect"/>
 </INPUT_LIST>
</BLOCK>
</RESOURCE_LIST>
725 —— <RESOURCE NAME="AnalogOut" TYPE="ANALOG_COMPARATOR_OUTPUT">
     <INPUT_LIST>
730 ——  <INPUT SOURCE="ADC" TYPE="BLOCK"/>
     </INPUT_LIST>
   </RESOURCE>
</RESOURCE_LIST>
</SHAPE>
<PARAMETER_LIST>
740 —— <PARAMETER NAME="ADCINPUT_SCB" TYPE="INPUT" SOURCE="ADC" REGISTER_NAME="CRI"
BITFIELD="SCB_INPUT_MUX_A"/>
      <PARAMETER NAME="ADCINPUT_SCA" TYPE="INPUT" SOURCE="ADC" REGISTER_NAME="CRI"
BITFIELD="SCA_INPUT_MUX_A_C"/>
      <PARAMETER NAME="ClockPhase" TYPE="BLOCK" SOURCE="ADC" REGISTER_NAME="CR0"
BITFIELD="CLOCK_PHASE"/>
      <PARAMETER NAME="TMRCLK" TYPE="CLOCK" SOURCE="TMR" REGISTER_NAME="DIG_Input"
BITFIELD="ClockSelect"/>
      <PARAMETER NAME="CTRCLKI" TYPE="CLOCK" SOURCE="CNT_LSB" REGISTER_NAME="DIG_Input"
BITFIELD="ClockSelect"/>
      <PARAMETER NAME="CTRCLKN" TYPE="CLOCK" SOURCE="CNT_MSB" REGISTER_NAME="DIG_Input"
BITFIELD="ClockSelect"/>
```

FIGURE 7D

```
</PARAMETER_LIST>
<API_REGISTER_ALIAS_LIST>
    <API_REGISTER_ALIAS_NAME="AtoDcr0" SOURCE="ADC" REGISTER_NAME="CR0"/>
    <API_REGISTER_ALIAS_NAME="AtoDcr1" SOURCE="ADC" REGISTER_NAME="CR1"/>
    <API_REGISTER_ALIAS_NAME="AtoDcr2" SOURCE="ADC" REGISTER_NAME="CR2"/>
    <API_REGISTER_ALIAS_NAME="AtoDcr3" SOURCE="ADC" REGISTER_NAME="CR3"/>
    <API_REGISTER_ALIAS_NAME="CounterMSBFN" SOURCE="CNT_MSB" REGISTER_NAME="DIG_BasicFunction"/>
```

742 — `</PARAMETER_LIST>`
744 — `<API_REGISTER_ALIAS_NAME=...>`

FIGURE 7D (Continued)

```xml
<API_REGISTER_ALIAS_NAME="CounterMSBSL" SOURCE="CNT_MSB" REGISTER_NAME="DIG_Input"/>
<API_REGISTER_ALIAS_NAME="CounterMSBOS" SOURCE="CNT_MSB" REGISTER_NAME="DIG_Output"/>
<API_REGISTER_ALIAS_NAME="CounterMSBDR0" SOURCE="CNT_MSB" REGISTER_NAME="DATA_0"/>
<API_REGISTER_ALIAS_NAME="CounterMSBDR1" SOURCE="CNT_MSB" REGISTER_NAME="DATA_1"/>
<API_REGISTER_ALIAS_NAME="CounterMSBDR2" SOURCE="CNT_MSB" REGISTER_NAME="DATA_2"/>
<API_REGISTER_ALIAS_NAME="CounterMSBCR0" SOURCE="CNT_MSB" REGISTER_NAME="CONTROL_0"/>
<API_REGISTER_ALIAS_NAME="CounterLSBFN" SOURCE="CNT_LSB" REGISTER_NAME="DIG_BasicFunction"/>
<API_REGISTER_ALIAS_NAME="CounterLSBSL" SOURCE="CNT_LSB" REGISTER_NAME="DIG_Input"/>
<API_REGISTER_ALIAS_NAME="CounterLSBOS" SOURCE="CNT_LSB" REGISTER_NAME="DIG_Output"/>
<API_REGISTER_ALIAS_NAME="CounterLSBDR0" SOURCE="CNT_LSB" REGISTER_NAME="DATA_0"/>
<API_REGISTER_ALIAS_NAME="CounterLSBDR1" SOURCE="CNT_LSB" REGISTER_NAME="DATA_1"/>
<API_REGISTER_ALIAS_NAME="CounterLSBDR2" SOURCE="CNT_LSB" REGISTER_NAME="DATA_2"/>
<API_REGISTER_ALIAS_NAME="CounterLSBCR0" SOURCE="CNT_LSB" REGISTER_NAME="CONTROL_0"/>
<API_REGISTER_ALIAS_NAME="TimerFN" SOURCE="TMR" REGISTER_NAME="Dig_BasicFunction"/>
<API_REGISTER_ALIAS_NAME="TimerSL" SOURCE="TMR" REGISTER_NAME="Dig_Input"/>
<API_REGISTER_ALIAS_NAME="TimerOS" SOURCE="TMR" REGISTER_NAME="Dig_Output"/>
<API_REGISTER_ALIAS_NAME="TimerDR0" SOURCE="TMR" REGISTER_NAME="Data_0"/>
<API_REGISTER_ALIAS_NAME="TimerDR1" SOURCE="TMR" REGISTER_NAME="Data_1"/>
<API_REGISTER_ALIAS_NAME="TimerDR2" SOURCE="TMR" REGISTER_NAME="Data_2"/>
<API_REGISTER_ALIAS_NAME="TimerCR0" SOURCE="TMR" REGISTER_NAME="CONTROL_0"/>
<API_REGISTER_ALIAS_NAME="Comp_Ctrl" SOURCE="AnalogComp" TYPE="RESERVED_RESOURCE"
REGISTER_NAME="AnalogComparatorControl"/>
</API_REGISTER_ALIAS_LIST>
</USER_MODULE>
</USER_MODULE_LIST>
</DEVICE_DB>
```

FIGURE 7E

TECHNIQUES FOR GENERATING MICROCONTROLLER CONFIGURATION INFORMATION

REFERENCE TO RELATED APPLICATIONS

This application is a continuation of U.S. patent application Ser. No. 14/445,364 filed Jul. 29, 2014, which is a continuation of U.S. patent application Ser. No. 13/305,680 filed Nov. 28, 2011 now U.S. Pat. No. 8,793,635 issued Jul. 29, 2014, which is a continuation of U.S. patent application Ser. No. 11/818,005 filed Jun. 12, 2007 now U.S. Pat. No. 8,069,428, issued Nov. 29, 2011, which is a continuation of U.S. patent application Ser. No. 10/002,726, filed Oct. 24, 2001, now U.S. Pat. No. 7,406,674, issued Jul. 29, 2008, all of which are incorporated by reference herein.

FIELD OF THE INVENTION

Embodiments of the present invention generally relate to the field of microcontrollers. More specifically, embodiments of the present invention pertain to a method and apparatus for generating the configuration information for microcontrollers.

BACKGROUND

Microcontrollers function to replace mechanical and electromechanical components in a variety of applications and devices. Microcontrollers have evolved since they were first introduced approximately 30 years ago, to the point where they can be used for increasingly complex applications. Some microcontrollers in use today are also programmable, expanding the number of applications in which they can be used.

However, even though there are a large number of different types of microcontrollers available on the market with a seemingly wide range of applicability, it is still often difficult for a designer to find a microcontroller that is particularly suited for a particular application. Unique aspects of the intended application may make it difficult to find an optimum microcontroller, perhaps necessitating a compromise between the convenience of using an existing microcontroller design and less than optimum performance.

In those cases in which a suitable microcontroller is found, subsequent changes to the application and new requirements placed on the application will likely affect the choice of microcontroller. The designer thus again faces the challenge of finding a suitable microcontroller for the intended application.

One solution to the problems described above is to design (or have designed) a microcontroller customized for the intended application. However, this solution may still not be practical because of the time needed to develop a custom microcontroller and the cost of doing so. In addition, should the design of the intended application be changed, it may also be necessary to change the design of the custom microcontroller, further increasing costs and lead times. Moreover, the option of designing a custom microcontroller is generally only available to very large volume customers.

Application specific integrated circuits (ASICs) may suggest a solution to the problem of finding a suitable microcontroller for an application. However, ASICs can also be problematic because they require a sophisticated level of design expertise, and the obstacles of long development times, high costs, and large volume requirements still remain. Solutions such as gate arrays and programmable logic devices provide flexibility, but they too are expensive and require a sophisticated level of design expertise.

In an effort to overcome some of these disadvantages, some microcontroller suppliers (for example, Cypress MicroSystems in Bothell, Wash.) have started to offer standard parts that combine a microprocessor with several user-configurable "building blocks." These building blocks may be configured to form many standard microprocessor peripherals, as well as to form unique peripherals as may be required by a specific application. Thus, a user of such products may be able to tailor (or configure) such a standard product to meet his specific microcontroller requirements, in less time and at less cost than through other means.

Unfortunately, the process by which such configurable blocks are configured is burdensome. The configurable blocks are designed to have wide application. As such, configuration generally involves setting a large number of bits in a specific sequence in order to define a specific function and interconnection with other blocks.

Many existing microcontrollers also have numerous configuration settings. For example, it is not unusual for a given input/output port to be designed such that it is either input or output, and it may further have a selectable pull up resistor.

In the prior art, the configuration process for both standard microcontrollers and configurable microcontrollers has been similar. A designer would study the device's information data sheets and manually determine the value and order of a long string of bits that would create the desired configuration. Subsequently, this string would be encoded into microprocessor instructions for execution during the early stages of operation, or initialization of the system.

In a very few instances, when a microcontroller has found very high acceptance in a particular application, high level tools have been created to support that particular microcontroller in that particular application. In such cases, a standard configuration is used and various software tools are built based on the standard configuration.

Unfortunately, in most design situations calling for a microcontroller, this is not the case. Configuration has been, for the most part, a labor-intensive manual process. Further, changes in the hardware configuration tend to ripple through to the higher level software, requiring changes and recompilation of application software as well as in any software tools designed to ease the development process. In effect, if the microcontroller hardware changed, the software had to change. Not just the application specific software, but also the software tools (such as compilers) had to change.

SUMMARY

Therefore, it would be advantageous to provide a method and system for the automatic generation of configuration information. A further need exists for a text readable description of the hardware resources of a microcontroller. A still further need exists for the use of open standards in describing configurable hardware.

Embodiments of the present invention provide a method and system for the automatic generation of configuration information. Further embodiments of the present invention provide for a text readable description of the hardware resources of a microcontroller. Still further embodiments of the present invention may use eXtensible Markup Language, an open standard, to describe configurable hardware.

A method and apparatus for configuring a microcontroller is disclosed. An XML description of the microcontroller's hardware resources may be accessed. A user may select from available hardware resources and pre-defined user modules to select a configuration. Configuration information, which may include register bit patterns and microprocessor instructions, may be automatically generated. Additionally, application programming interface calls and structure, as well as interrupt vector tables may be automatically generated.

Another embodiment of the present invention may access predetermined configurations of a microcontroller's hardware resources.

In one embodiment of the present invention, a microcontroller having a number of configurable building blocks may be automatically configured.

In another embodiment of the present invention, user selected configuration choices are combined with predetermined configurations to automatically generate configuration information.

In yet another embodiment of the present invention, user configuration selections are checked against the hardware description for validity.

In still another embodiment of the present invention, a user may edit configurable parameters within a computer implemented graphical user interface.

Embodiments of the present invention provide improved ease of use and the ability to manage greater complexity in the configuration of configurable microcontrollers.

Therefore, these and other objects and advantages of the present invention will become obvious to those of ordinary skill in the art after having read the following detailed description of the preferred embodiments that are illustrated in the various drawing figures.

BRIEF DESCRIPTION OF THE DRAWINGS

Embodiments of the present invention are illustrated by way of example and not by way of limitation, in the figures of the accompanying drawings and in which like reference numerals refer to similar elements and in which:

FIG. 1 is an illustration of a method of configuring a microcontroller, according to an embodiment of the present invention.

FIGS. 7A, 7B, 7C, 7D and 7E illustrate an exemplary User Module description written in eXtensible Markup Language (XML), as may be used by embodiments of the present invention.

DETAILED DESCRIPTION OF THE INVENTION

Figure 2:
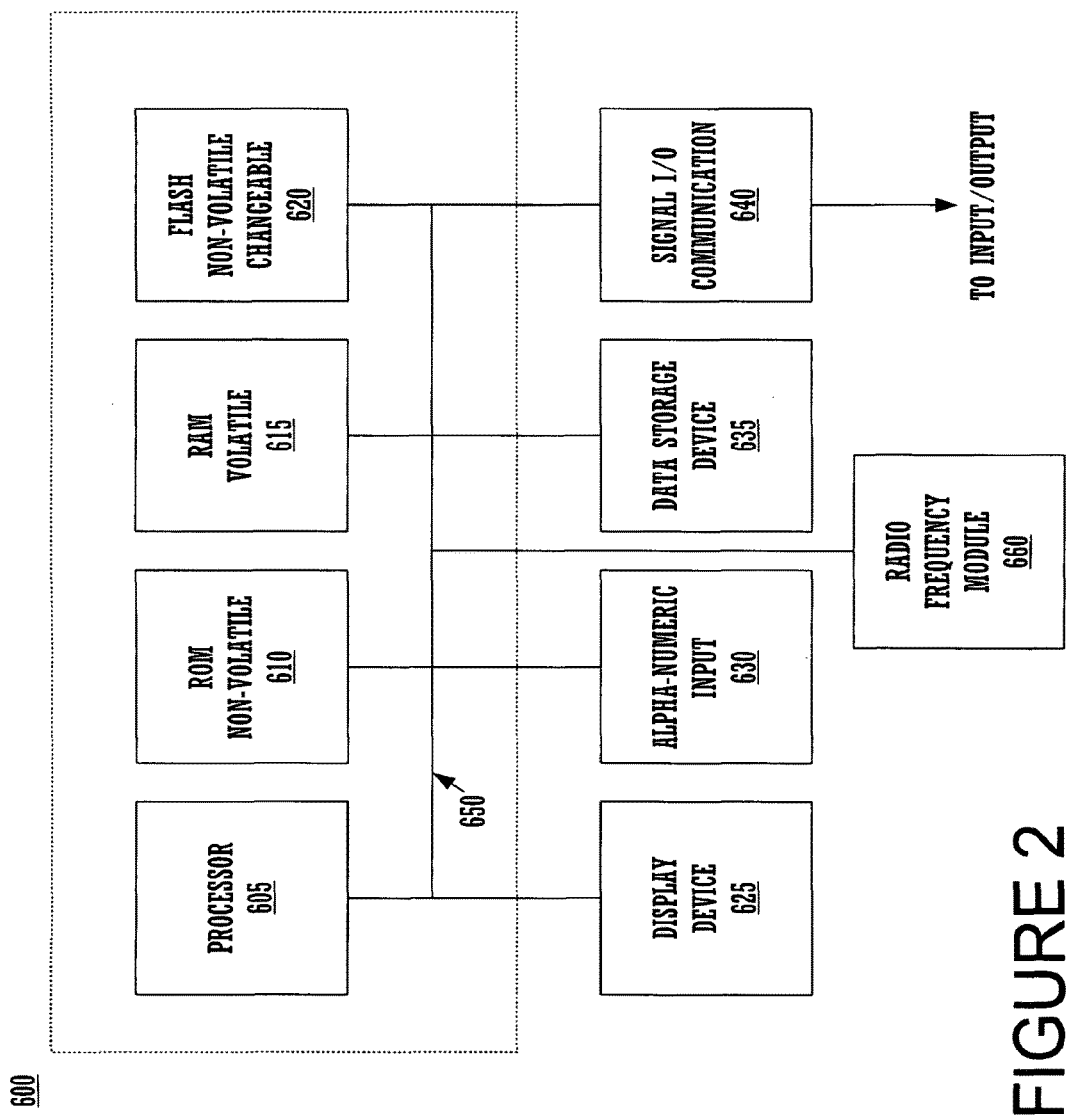
FIG. 2 is a block diagram of a computer system, which may be used as a platform to implement embodiments of the present invention.

In the following detailed description of the present invention, method and apparatus for generating microcontroller configuration information, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Notation and Nomenclature

Some portions of the detailed descriptions which follow (e.g., process 100) are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "indexing" or "processing" or "computing" or "translating" or "calculating" or "determining" or "scrolling" or "displaying" or "recognizing" or "generating" or "accessing" or "selecting" or "tracking" or "displaying" or "informing" or "editing" or "adding" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Method and Apparatus for Generating Microcontroller Configuration Information

This Application makes reference to co-pending commonly-owned U.S. patent application Ser. No. 10/033,027, filed Oct. 22, 2001, entitled "Microcontroller System on a Chip," which is hereby incorporated herein by reference in its entirety.

The present invention is described in the context of development tools for designing with embedded microcontrollers. However, it is appreciated that the present invention may be utilized in other types of computer-aided hardware and software design systems (for example compilers) where it may be necessary to describe various resources.

Traditional microcontrollers have a fixed set of digital and/or analog peripherals. Many of these peripherals may have configurable parameters. For example, a universal asynchronous receiver transmitter (UART) may have provision for several userselectable configurations. These may include a choice of baud rates, clock sources (internal or external), number of stop bits, parity (even, odd or none), etc. However, all such configuration parameters apply to the same function, that of UART. Such a fixed peripheral generally may not be reconfigured to perform a completely different function, for example, a display controller.

A new class of microcontroller provides an analog and/or digital subsystem comprising many dynamically configurable blocks. An example of such a device is the CY8C25x/26x family, commercially available from Cypress Micro-Systems of Washington. These blocks do not, in general, provide the equivalent function of a traditional microprocessor peripheral. They may be thought of as fundamental building blocks. However, these blocks may be combined to create such functions. In further contrast to the fixed peripherals of a traditional microcontroller, these blocks may be recombined in a different combination to perform a different function.

Importantly, these different combinations of blocks producing different functions may exist at different times within the same system. For example, a set of blocks configured to perform the function of analog to digital conversion may sample a signal. After processing that signal in the digital domain, those same blocks (perhaps in conjunction with a few others) may be recombined in a different configuration to perform the function of digital to analog conversion to produce an output signal.

The present invention provides a method and system for managing the configuration of and generating configuration information for both traditional microcontrollers with configurable peripherals and this new class of microcontrollers with dynamically configurable blocks.

FIG. 1 illustrates a method 100 of configuring a microcontroller, according to an embodiment of the present invention.

In step 110, a description of the hardware resources may be accessed. This description may include a definition of the underlying hardware, i.e., what peripherals or configurable blocks are available, and the configurable parameters that must be set to operate. In a preferred embodiment of the present invention, the underlying hardware is described in well understood names versus mnemonics, e.g., "conversion_complete_interrupt" versus "INT6." It is appreciated that other well-known naming conventions are well suited to embodiments of the present invention.

In a preferred embodiment, this description is a data set, which may be contained in a plurality of files substantially compliant with eXtensible Markup Language, or XML.

XML is a well-known open standard, and is text based. As a text based structure, a wide variety of computer tools may be used to create and edit such a description. Being text based, it is also compatible with the widest variety of network transmissions and can be easily transferred between computers having different character set descriptions, such as ASCII and EBCDIC. Descriptions having non-text characters may be more limited in their applications.

It is appreciated, however, that embodiments of the present invention are well suited to other well-known data formats.

In an embodiment of the present invention, a separate software tool accesses the descriptive data set. A significant benefit of separating the data set from the software tool is that the software tool does not have to change (e.g., rewriting or recompiling) if the hardware changes. Only the data set needs to be modified to reflect such a change. Changes to a text based data file are significantly less complex than changes to executable software.

Additional benefits derive from this arrangement as well. For example, supporting new hardware may only require the mere addition of new files into a module library (directory). Additionally, the hardware description files may be used across a variety of computer platforms and operating systems. Further, since the software tool isn't changing with each new or modified piece of hardware, engineering resources may be dedicated to increasing the quality of the software, rather than supporting new functionality.

This description may also include lists of standard configurations that have been predetermined, either by the users or the manufacturers, to be useful. Such a configuration in a traditional microcontroller might be "RS-232 9600 baud," which would be a set of bit patterns to configure the (fixed function) UART to select the appropriate clock source, stop bits, parity, etc. for this standard form of communication.

Similarly, a standard configuration of configurable blocks might be an analog to digital converter labeled "6_bit_ADC." This standard configuration would combine analog and digital blocks to produce a six-bit analog to digital converter.

We label such standard configurations as user modules, and such user modules may be defined in the description of hardware resources.

Still referring to FIG. 1, in step 120 a user, typically interacting with a computer implemented design tool, may select from available configurations, including user modules and other capabilities of the microcontroller hardware, to produce a desired configuration.

In a preferred embodiment of the present invention, the design tool may track resources as they are assigned, providing feedback to the designer such as available blocks and user modules. It is appreciated that such feedback is not required in embodiments of the present invention.

In step 130, the bit patterns corresponding to the selected configuration may be automatically generated. In optional step 140, microprocessor instructions may be generated which, when executed cause the hardware to be configured according the selected configuration.

In optional step 150, application programming interface (API) call structures may be automatically generated. Such APIs may correspond to user modules. For example, using the previous example of "6_BIT_ADC," an API call might take the form of "GET_6_BIT_ADC_VALUE." Using meaningful names in such an automatically generated structure is more useful to human designers who must maintain the software than pseudo-random unique names generated by computer processes, such as "ZYX-1." Microprocessor instructions required to perform this task and return the value to the calling software may be automatically generated.

In optional step 160, an interrupt vector table may be automatically generated. Again using the example of "6_BIT_ADC," instructions to set the "conversion complete" interrupt to level 6 may be automatically generated. Further, instructions to initialize the interrupt vector corresponding to level 6 may be automatically generated, and a shell for the interrupt service routine may be automatically created. Finally, since this example also includes an API, the shell software may be completed to, for example, read the result register from the "6_BIT_ADC" and place that value on the stack to be passed back to the calling program.

FIG. 2 illustrates circuitry of computer system 600, which may form a platform for the implementation of embodiments of the present invention. Computer system 600 includes an address/data bus 650 for communicating information, a central processor 605 functionally coupled with the bus for processing information and instructions, a volatile memory 615 (e.g., random access memory RAM) coupled with the bus 650 for storing information and instructions for the central processor 605 and a nonvolatile memory 610 (e.g., read only memory ROM) coupled with the bus 650 for storing static information and instructions for the processor 605. Computer system 600 also optionally includes a changeable, non-volatile memory 620 (e.g., flash) for storing information and instructions for the central processor 605, which can be updated after the manufacture of system 600.

Computer system 600 also optionally includes a data storage device 635 (e.g., a rotating magnetic disk) coupled with the bus 650 for storing information and instructions.

Also included in computer system 600 of FIG. 2 is an optional alphanumeric input device 630. Device 630 can communicate information and command selections to the central processor 600. Device 630 may take the form of a touch sensitive digitizer panel or typewriter-style keyboard. Display device 625 utilized with the computer system 600 may be a liquid crystal display (LCD) device, cathode ray tube (CRT), field emission device (FED, also called flat panel CRT), light emitting diode (LED), plasma display device, electro-luminescent display, electronic paper or other display device suitable for creating graphic images and alphanumeric characters recognizable to the user. Optional signal input/output communication device 640 is also coupled to bus 650.

System 600 optionally includes a radio frequency module 660, which may implement a variety of wireless protocols, for example IEEE 802.11 or Bluetooth.

Figure 3:
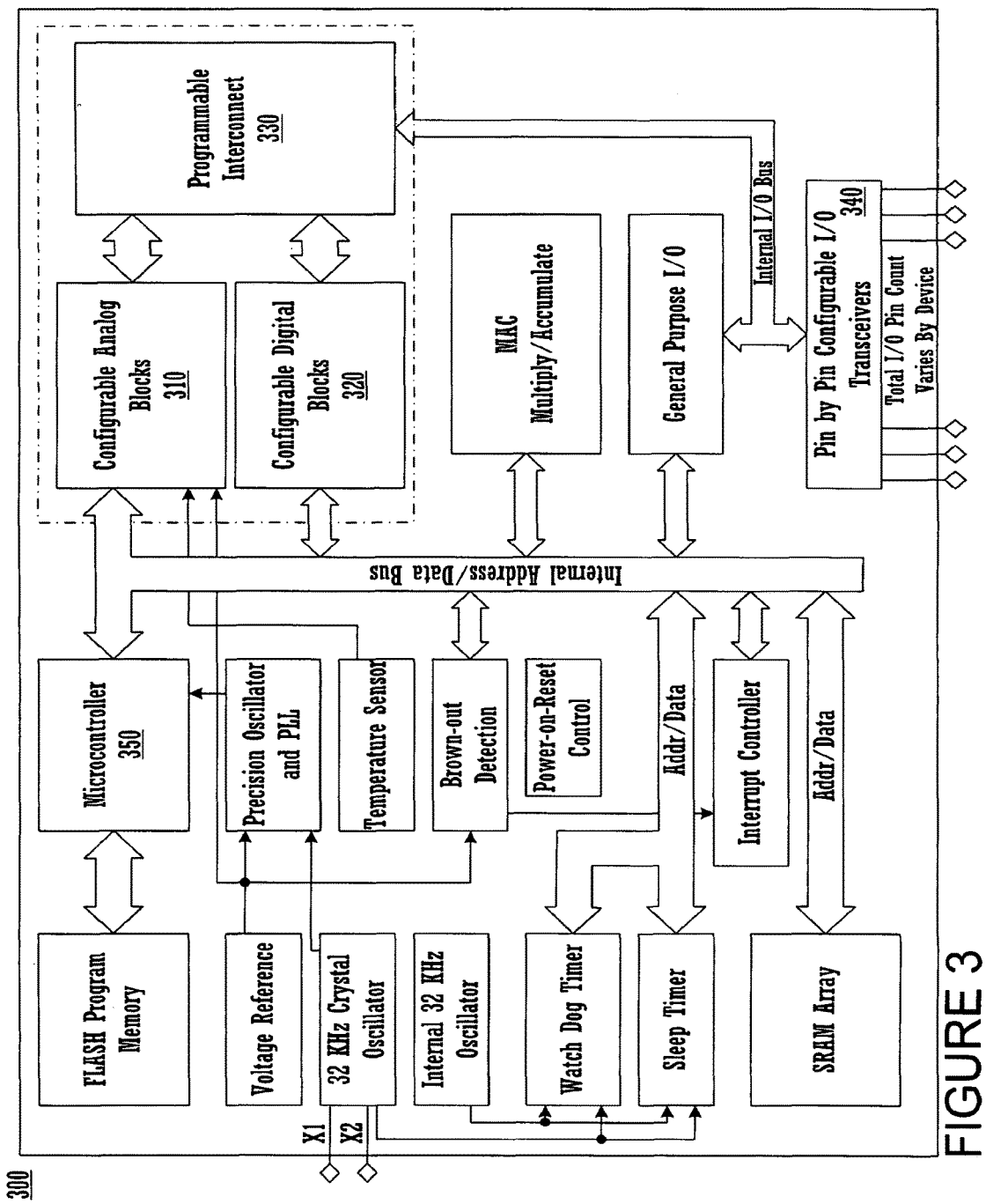
FIG. 3 illustrates an exemplary configurable microcontroller system, upon which embodiments of the present invention may be practiced.

FIG. 3 illustrates an exemplary configurable microcontroller system 300, upon which embodiments of the present invention may be practiced. It is appreciated that the present invention is well suited to a wide range of well know and future configurable microcontroller systems.

Microcontroller system 300 may contain microcontroller 350. Microcontroller 350 may execute instructions stored within memory elements of microprocessor system 300 to configure configurable elements of microcontroller system 300, including analog SoCblocs 310, Digital SoCblocs 320, programmable interconnect 330 and configurable 1/0 transceivers 340. Configuration information for these configurable elements may have been generated by embodiments of the present invention.

Microcontroller system 300 may include analog SoCblocs 310. "SoC" is a trade name of Cypress MicroSystems of Washington for "System on (a) Chip," and refers to an architecture of low-level building blocks for creating a wide variety of on-chip functions associated with a microcontroller. Analog SoCblocs 310 may be an array of such low level building blocks designed to implement analog functions. Similarly, digital SoCblocs 320 may be an array of low level building blocks designed to implement digital functions.

Programmable interconnect 330 may be an array of configurable multiplexing elements designed to interconnect low level building blocks together and with other system resources. Configurable 1/0 transceivers 340 allow signals created or accessed by configurations of building blocks to communicate off-chip.

Figure 4:
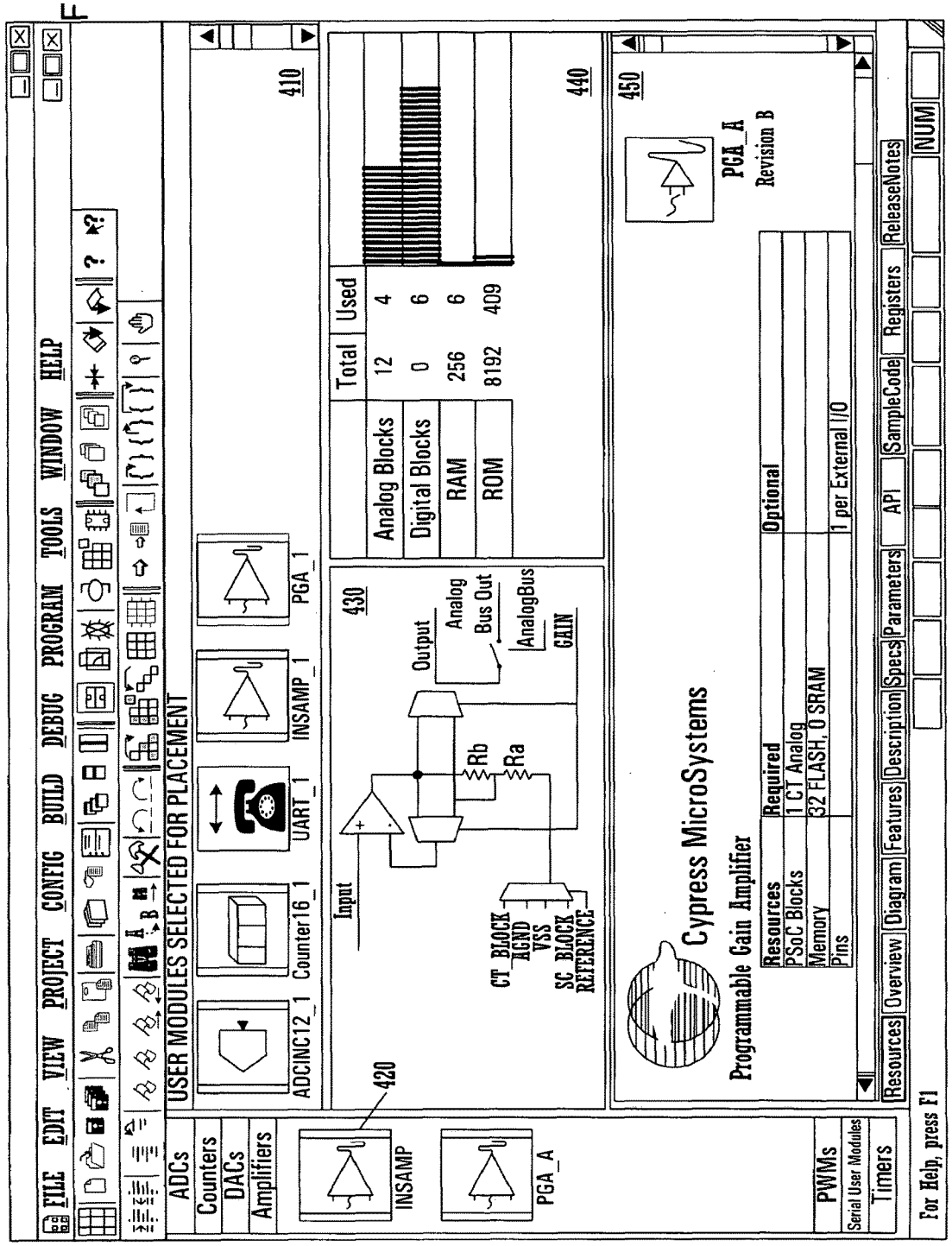
FIG. 4 shows an exemplary User Module selection display, according to an embodiment of the present invention.

FIG. 4 shows an exemplary User Module selection display 400, according to an embodiment of the present invention. User Module selection display 400 may contain User Module Catalog window 420. User Module Catalog window 420 may display all User Modules automatically loaded from the User Module libraries. The User Modules may be organized by type. The displayed names correspond to the type of the User Module.

User Module Selection Bar 410 may display the User Modules selected for the current project. The instance name for the User Module may be shown below the icon in User Module Selection Bar 410. The instance name can be changed at any time before code generation.

Block Diagram 430 and Data Sheet 450 correspond to the User Modules highlighted in the User Module catalog window 420. Block Diagram 430 may provide a block diagram of the highlighted user module, and may indicate configurable elements of the user module.

Data Sheet 450 may display a detailed datasheet for the selected user module, as would have been contained in a data book or accessed via the world wide web in prior art systems. In this manner, a designer has immediate access to detailed engineering information regarding the selected user module, without having to refer to a printed book, or open an internet browser window which may obscure his work.

Embodiments of the present invention may be configured to allow only User Modules that are seen in the User Module Selection bar 410 to be placed during User Module placement.

Resource assignment window 440 may display the total resources available in a particular device, and a summary of the resources used as they are placed into the design. Resource assignment window 440 may display a summary of resources used/assigned in numerical and/or bar graph formats. Resource assignment window 440 may further change the color of the graph, for example, to yellow, to indicate that a specific resource, for example digital blocks, are almost used up. In addition, resource assignment window 440 may display the graph in yet another color, for example red, to indicate that all available resources of a particular type have been used.

Figure 5:
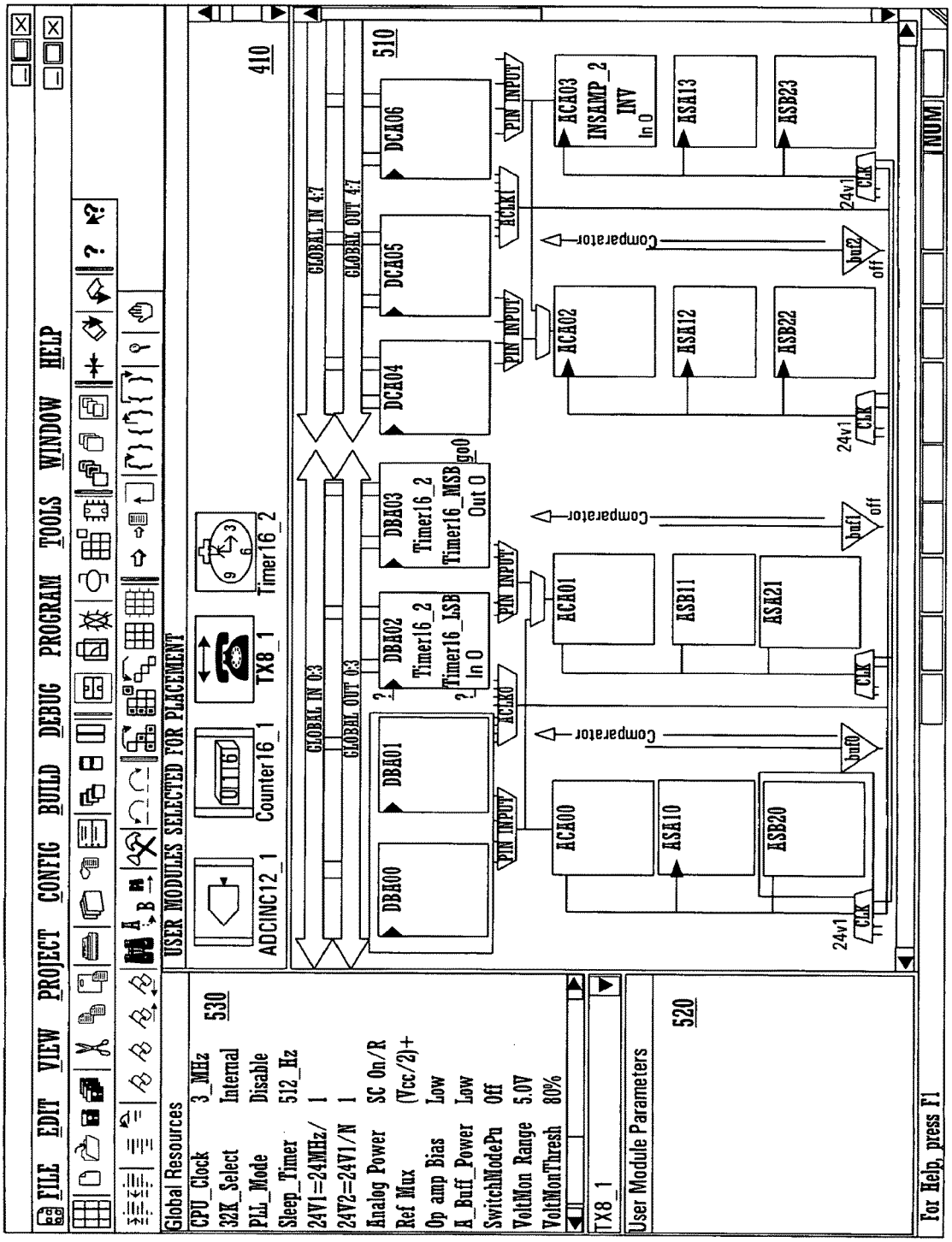
FIG. 5 shows an exemplary User Module placement display, according to an embodiment of the present invention.

FIG. 5 shows an exemplary User Module placement display 500, according to an embodiment of the present invention. User Module placement involves the placement of selected User Modules onto the PSoC blocks available on the selected device.

User Module placement display 500 may include placement pane 510. Placement pane 510 may display a graphical representation of placed blocks and signal routings. The graphical placement and routing may correspond to the physical placement of such blocks on an integrated circuit, or the graphical placement and routing may correspond to simplified renderings of the microcontroller architecture.

Placed User Modules may have colored rectangles around their icons in the User Module Selection Bar 410 and one or more blocks in the Placement Pane 510 may be colored with the same color. The instance name and block name will also be shown on the corresponding blocks. Embodiments of the present invention may be configured to allow only placed User Modules to be parameterized and included in application generation.

User Module placement display 500 may also include global resources window 530 that displays a list of the global resources available in the chosen device.

User Module placement display 500 may further include user module parameters window 520 that displays a list of configurable parameters for the user module selected in user modules selection bar 410. In this example, there are no user configurable parameters for the selected user module "TX8_1."

Figure 6:
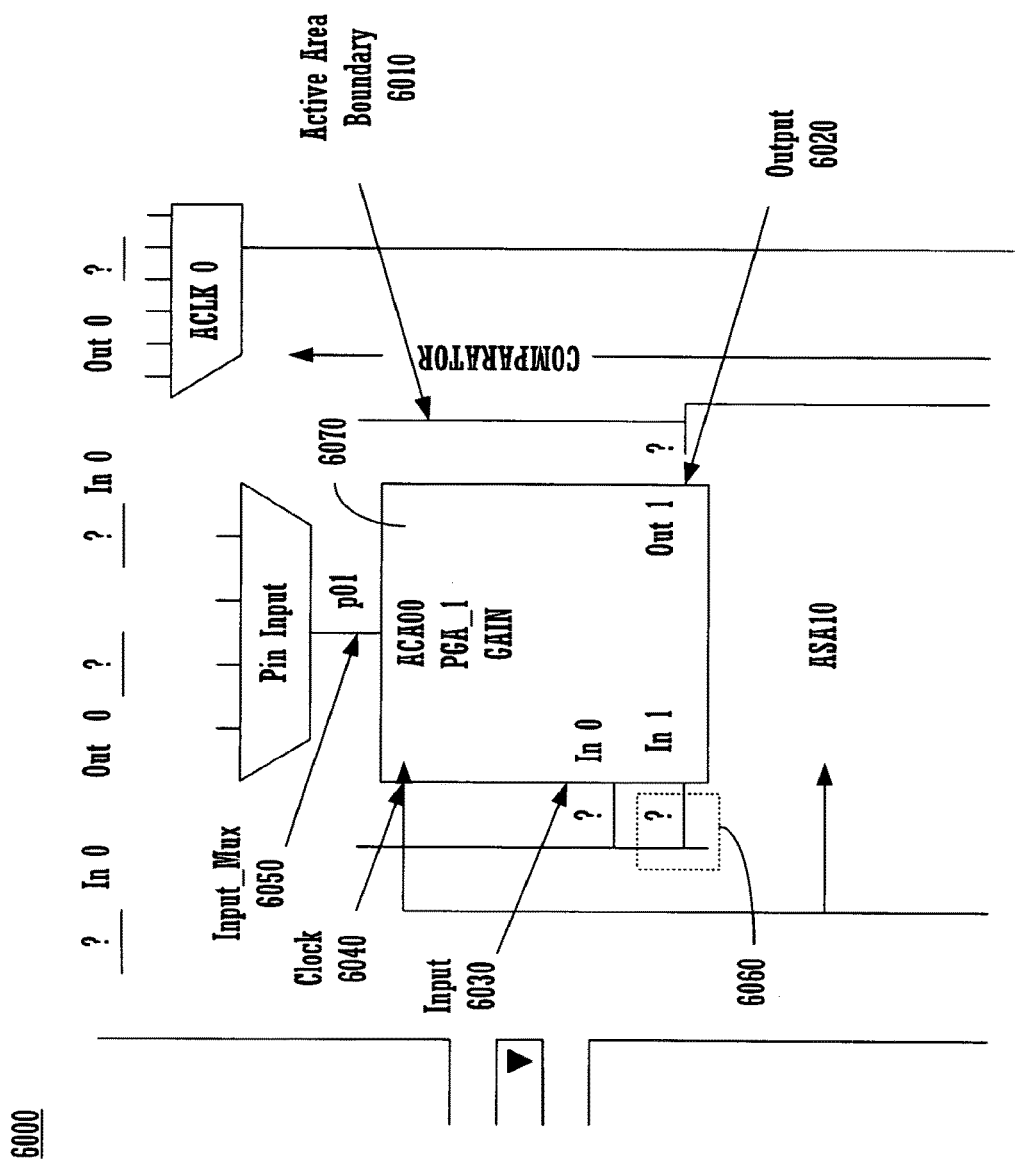
FIG. 6 shows an exemplary screen detail of elements of FIG. 5, according to an embodiment of the present invention.

FIG. 6 shows an exemplary screen detail 6000, which is a detail of placement pane 510. Detail 6000 shows the active areas for block parameters, in particular block 6070, which may be displayed or edited by a user. In general, the active areas for the cursor indicator on block 6070 associated with the parameter may be within the graphical representation of the block 6070 immediately surrounding the text block and outside the block 6070 immediately adjacent to the text block while extending to the end of the active area boundary line 6010.

When the mouse or other pointing device causes a cursor indicator (not shown) to move within the active area of a parameter, for example parameter text area 6060, the cursor may change to a horizontal Dual In-line Package (DIP) shape. If the cursor is left over the active area for about one second, then a tool tip may appear showing the name of the parameter and its value.

The parameter value may be shown in the active area of the parameter immediately above the line, for example parameter area 6060. If the parameter value has not yet been set, then the line may be rendered in an indicator color, for example, red, and a question mark may be displayed in place of the parameter value. The question mark may also be displayed in the same indicator color.

The CLOCK parameter 6040 may always map to an area in the upper left corner of the block 6070. Embodiments of the present invention may be configured so that there is only one parameter whose TYPE attribute is set to CLOCK in any one PSoC block within any User Module. The CLOCK parameter does not have a text block similar to parameter text area 6060, but shows the triangle symbol within the block 6070.

The INPUT 6030 parameters (including parameter text area 6060) appear in the lower left area of the block 6070. A maximum of 2 inputs can be shown on a block. The text may always be shown as "In 0" or "In 1" that are assigned in alphabetical order of the INPUT parameters. If only one INPUT parameter is defined for a particular block, then that input will appear at the bottom of the block and be shown as "In 0."

The INPUT MUX parameter 6050 is a special case parameter that may cause the line to be drawn between the top row of analog PSoC blocks, the ANALOG_CT blocks, and the Pin Input MUX control above them. The INPUT_MUX 6050 parameter does not have a bitfield associated with it, so the BITFIELD attribute should be set to NONE. Consequently, an INPUT_MUX 6050 parameter will not appear in the Parameter Pane. The value shown next to the line is controlled by the Pin Input MUX control above. The INPUT MUX 6050 parameter must only be used with ANALOG_CT blocks.

The OUTPUT 6020 parameters appear in the lower right area of the block. A maximum of 2 outputs can be shown on a block. The text may be always shown as "Out 0" or "Out 1" that are assigned in alphabetical order of the OUTPUT parameters. If only one OUTPUT parameter is defined for a particular block, then that parameter will appear at the bottom of the block and be shown as "Out 0."

The OUTPUT_O and OUTPUT_I parameters are similar to the OUTPUT 6020 parameter except that the position of each parameter type is fixed in the block and the line outside the block is extended to connect to one of the two bus lines to the right of the blocks. The OUTPUT_O parameter appears in the upper output position and the line extends to the comparator bus line. The OUTPUT_I parameter appears in the lower output position and the line extends to the analog bus line.

The OUTPUT_O_HIDDEN and OUTPUT_I_HIDDEN parameters are similar to the OUTPUT_O and OUTPUT_I parameters, except that the "_HIDDEN" implies that the parameter value itself is not made available to the GUI. For these parameters, the lines are drawn to the respective bus line, but the text block within the block and the parameter value may not be shown.

FIG. 7A, 7B, 7C, 7D and 7E illustrate an exemplary User Module description 700 written in eXtensible Markup Language (XML), as may be used by embodiments of the present invention.

The syntax of XML files follows other mark-up languages in that it consists of tags, which represent elements. Elements can contain attributes, and, in turn, attributes have values. All names in XML files, whether they are tag names, attribute names, or attribute values, are case sensitive.

The user module description 700 may contain data including user module resource requirements, interconnection details, parameter description, and API code generation substitutions. Ultimately, the user module description 700 may define registers, which are divided into bitfields. Bitfields may be set according to User Module placement and parameterization, thereby setting registers. The bitfields are associated with resources, which are presented to the user, for example in screen detail 6000. The resources are also how the GUI and the User Module XML file access the bitfields.

The specific device description files reference the base device description file and may define the pins that are available on the part and the RAM and ROM that is available on the part. The specific device description files also cover all parts that share a common package type insomuch as the package falls into a similar category, for example 28-pin dual-inline package, or 44-pin TQFP. Whether the part is DIP or TSOP does may not distinguish it as a distinct part description. In other words, if a part shares a common pinout, including total pin count, with another part, then it may share a specific device description file.

According to an embodiment of the present invention, the values of some of the attributes in user module description 700 are controlled by the names used in the Device Description XML files, while others are controlled by the elements and attributes in the User Module XML file itself. Each User Module XML file may contain the specifications for one, and only one User Module. From the root node <PSOC_DEVICE_DB> 702, the User Module XML file may contain one-and-only-one <PSOC_USER_MODULE_LIST> 704 element. The <PSOC_USER_MODULE_LIST> 704 element can contain a multiplicity of <PSOC_USER_MODULE> elements, for example <PSOC_USER_MODULE_LIST> 706, but generally will contain only one. The <PSOC_USER_MODULE> element may have the following attributes as described below.

A NAME attribute may be the name of the User Module. A TYPE attribute may be the enumerated type of User Module. "HTML" attribute may be the name of file containing a User Module data sheet, for example data sheet 450 in FIG. 4. The ICON attribute may be the name of file containing a User Module icon graphic. METAFILE attribute may be the name of file containing User Module block diagram. API_PATH_TYPE attribute may be the XML file path relative to other files. RAM attribute may be the amount of RAM used by the User Module API. ROM attribute may be the amount of ROM used by the User Module API.

The NAME attribute is the reference for the User Module used by the Device Editor. It is also the name that appears in under the icon in the User Module Catalog on the User Module Selection view.

The TYPE attribute is an enumeration that places the User Module in a category. The User Modules types serve to partition the User Modules onto the different Outlook bars in the User Module catalog.

The HTML, ICON, and METAFILE attributes relate to the other files used in the User Module Selection view. All of these attribute values are the literal file names that must include the extension. The HTML attribute specifies the data sheet file that is displayed in the Data Sheet area of the view. The METAFILE attribute specifies the extended metafile that contains the User Module block diagram. The block diagram appears in the Block Diagram pane of the User Module Selection view. The ICON attribute specifies the file containing the User Module icon. The icon is used in the User Module Catalog pane and the User Module Selection Bar.

The RAM and ROM attributes are the values used to determine the resource usage for the User Module. The values of the RAM and ROM attributes are subtracted from the total amount available on the device when the User Module is selected. The resource usage gauge in the configuration tool tracks the RAM and ROM usage for the User Modules selected in the current configuration.

The API_PATH_TYPE attribute specifies the relative path between the User Module XML file and the other files. With the current library scheme, all User Modules should be set for CUSTOM. The other value, NORMAL is not used or the attribute should not be included.

The <PSOC_USER_MODULE> element may contain one, and only one of each of the following elements <SHAPE>, <PARAMETER_LIST> and <API_REGISTER_ALIAS_LIST>.

The <SHAPE> element, for example <SHAPE> element 707, specifies the PSoC blocks and the resources required by the User Module, and establishes some reference names for use in other parts of the User Module description. The <SHAPE> element has only a SHAPE_TYPE attribute. The SHAPE_TYPE attribute may be set to BLOCK_LIST.

The <SHAPE> element consists of one or more <BLOCK_LIST> elements, for example <BLOCK_LIST> element 710, and at most one <RESOURCE_LIST> element.

The <BLOCK_LIST> element describes a collection of PSoC blocks that are connected between blocks within the <BLOCK_LIST> element. When multiple <BLOCK_LIST> elements are included within a <SHAPE> element, each <BLOCK_LIST> is placed on the device PSoC blocks independently. Connections between PSoC blocks from distinct <BLOCK_LIST> elements can exist through resources identified in the <RESOURCE_LIST> element.

The <BLOCK_LIST> has no attributes and consists of several <BLOCK> elements, for example <BLOCK> element 710. The <BLOCK> elements specify the following information: Block name, the type of block required, Block interrupt generation, Block personalization and Block interconnection.

The <BLOCK> element may have the attributes described below. NAME attribute may be the block reference name. The TYPE attribute may be the enumerated PSoC block type. The INTERRUPT_SOURCE attribute may be the block interrupt handler name. The INTERRUPT_TYPE attribute may be the enumerated interrupt calling type.

The NAME attribute is a local name that identifies the block within the User Module description. The NAME must be unique within a User Module, but similar names can be used in different User Modules. The NAME attribute value appears in the GUI in the User Module Placement view. When a User Module is placed, the PSoC blocks onto which the User Module is placed show the instance name of the User Module with the local name directly under it.

The TYPE attribute specifies the type of PSoC block that the User Module requires. The valid values for the TYPE attributes include: DIGITAL, DIGITAL_COMM, ANALOG_CT, ANALOG_SCA, ANALOG_SCB and ANALOG_SC.

The difference between this list and the PSoC block types used in the device description is the addition of the ANALOG_SC type in the User Module description. The ANALOG_SC block type indicates that the specified block can be placed on an ANALOG_SCA or an ANALOG_SCB block. Similarly, a DIGITAL block type can be placed on a DIGITAL or a DIGITAL_COMM block.

The INTERRUPT_SOURCE and INTERRUPT_TYPE attributes relate to an interrupt handler associated with the PSoC block. If an interrupt handler is not associated with the PSoC block, then the INTERRUPT_SOURCE and INTERRUPT_TYPE attributes should not be included in the <BLOCK> element. The INTERRUPT_SOURCE attribute value is a name that is used to generate the interrupt handler name. The INTERRUPT_SOURCE attribute value is appended to the User Module instance name to form the interrupt handler name. The INTERRUPT_TYPE attribute specifies whether a LJMP (long jump) or a CALL (to subroutine) is used when calling the interrupt handler from the vector table.

The <BLOCK> element may consist of one <REGISTER_LIST> element and at most one <INPUT_LIST> element.

The <REGISTER_LIST> element, for example <REGISTER_LIST> element 712, may specify the PSoC block personalization. The bitfield values set in this element are set on the PSoC block where the User Module is located.

The <REGISTER_LIST> consists of one-or-more <REGISTER> elements, for example <REGISTER> element 714. The <REGISTER> element may have a NAME attribute and one <BITFIELD_LIST> element. The NAME attribute value must match one of the names of the registers in a PSoC block of similar type contained in the <COMMON_BLOCK_LIST> element of the device description.

The <BITFIELD_LIST>, for example <BITFIELD_LIST> 716, consists of one-or-more <BITFIELD> elements. The <BITFIELD> elements, for example <BITFIELD> element 718, may have NAME and VALUE attributes. The bitfield NAME attribute must be one of those included in the <BITFIELD_LIST> of a block of similar type contained in the <COMMON_BLOCK_LIST> of the device description. Similarly, the VALUE attribute must be a value that is valid for the specified bitfield as defined in the device description.

The <INPUT_LIST> element, for example <INPUT_LIST> 720 of FIG. 7B, specifies the interconnection between blocks and resources within the User Module description. The <INPUT_LIST> element has no attributes and consists of one-or-more <INPUT> elements. The <INPUT> element specifies a connection between the block and another block or resource within the User Module description. The relevance of an <INPUT> element is that a connection with another PSoC block or resource on the device implies that a bitfield within the block registers must be set to a particular value.

The <INPUT> element may have the attributes described below. The SOURCE attribute may be the name of the resource or PSoC block that is the source of the input. The TYPE attribute may be an enumeration of the type of the SOURCE, either BLOCK or RESERVED_RESOURCE. The BLOCK_TYPE attribute may be an enumeration of the type of the block on which the block is placed, either ANALOG_SCA or ANALOG_SCB. The REGISTER_NAME attribute may be the name of the register within the block <REGISTER_LIST> containing the relevant bitfield. The BITFIELD attribute may be the name of the bitfield associated with the input.

The SOURCE attribute must match the name of another block or resource within the User Module.

The TYPE attribute must match the SOURCE, whether the SOURCE is a BLOCK or RESERVED_RESOURCE.

The BLOCK_TYPE attribute is only relevant when the TYPE of the <BLOCK> element is ANALOG_SC. In this case, the bitfield for a connection may vary depending on whether the <BLOCK> element was placed on an ANALOG_SCA or an ANALOG_SCB block. If the bitfield is different, then distinct <INPUT> elements specifying both cases must be included in the <INPUT_LIST> element for that <BLOCK> element.

The REGISTER_NAME attribute specifies the NAME attribute of the <REGISTER> element in the <REGISTER_LIST> element of the <BLOCK> that contains the relevant bitfield. If the bitfield name is unique, then the REGISTER_NAME can be omitted, but it is better practice to always include it.

The BITFIELD attribute value specifies the NAME attribute of the <BITFIELD> element that is associated with the input.

The <RESOURCE_LIST> element, for example <RESOURCE_LIST> element 725 of FIG. 7D, specifies the resources that the User Module requires. The User Module uses resources to enable parameterization, enable connection between blocks, or restrict placement options. There may be only one <RESOURCE_LIST> element in a <SHAPE> element. The one <RESOURCE_LIST> element contains all resources used by the User Module.

A <RESOURCE_LIST> consists of one-or-more <RESOURCE> elements. The <RESOURCE> element specifies the type of resource and connections from other blocks or resources in the User Module description. The <RESOURCE> element may have attributes as described below.

The NAME attribute may be the reference name for the resource. The TYPE attribute may be the resource type.

The NAME attribute defines the reference name for the resource within the User Module. The TYPE attribute specifies the type of resource required. Valid values for TYPE may include: COLUMN_INPUT, ANALOG_COLUMN_CLOCK_MUX, ANALOG_CLOCK_SELECT, ANALOG_DRIVER, GLOBAL_BUS, ANALOG_COMPARATOR_OUTPUT, ANALOG_COLUMN_OUTPUT, ANALOG_COMPARATOR_CONTROL, DECIMATOR, ANALOG_MODULATOR, PIN, TEMPERATURE_VOLTAGE and DIRECT INPUT.

These values correspond to resources in the <RESERVED_RESOURCE_LIST> in the device description.

The <RESOURCE> element contains an <INPUT_LIST> element, for example <INPUT_LIST> element 730 of FIG. 7D. The <INPUT> elements within the <INPUT_LIST> are similar to the <INPUT_LIST> element in the <BLOCK> element. The <INPUT> element for resources may have the following attributes.

The SOURCE attribute may be the name of the resource or PSoC block that is the source of the input. The TYPE attribute may be an enumeration of the type of the SOURCE, either BLOCK or RESERVED_RESOURCE. The REGISTER_NAME attribute may be the name of the register within the block <REGISTER_LIST> containing the relevant bitfield. The BITFIELD attribute may be the name of the bitfield associated with the input.

In many cases, the resource does not have a register associated with it. In these cases, the BITFIELD attribute is set to NONE and the REGISTER_NAME attribute can be omitted.

The <PARAMETER_LIST> element, for example <PARAMETER_LIST> element 740 of FIG. 7D, exposes bitfields to the GUI to allow the user to set their values. The <PARAMETER> element associates the parameter with a bitfield defines in the User Module shape. The values shown for the parameters are controlled by the bitfield values or a <PARAMETER_VALUE_LIST> element. The value list can also be limited with an <ALLOWED_VALUE_LIST> element. If a parameter has an ambiguous SOURCE, in terms of block type, then it is possible that the bitfield associated with the parameter has a different name depending on block placement. For example, if the SOURCE block is TYPE ANALOG_SC, then some of the registers have different names for the same bitfield in an ANALOG_SCA block as opposed to an ANALOG_SCB block. In this case, a parameter should be specified for both block types based on the unique register names. When the block is placed, the parameter that does not apply will disappear.

The <PARAMETER_LIST> element may contain at least one <PARAMETER> elements. The <PARAMETER> element may have the following attributes. The NAME attribute may be the name of parameter. The TYPE attribute may be the enumeration of parameter type. The SOURCE attribute may be the name of PSoC block or resource containing the bitfield associated with the parameter. The REGISTER_NAME attribute may be the name of the register containing the bitfield associated with the parameter. The BITFIELD attribute may be the name of the bitfield associated with the parameter. The ORDER attribute may be the order that the parameters appear in the list. The VALUE attribute may be the default value. The VALUE_TYPE attribute may be ENUM or INT. The default value is ENUM if attribute is missing. The MIN attribute may apply only to VALUE_TYPE=INT, which is the minimum inclusive parameter value. The MAX attribute may apply only to VALUE_TYPE=INT, which may be the maximum inclusive parameter value.

The NAME attribute may be the reference name for the parameter within the User Module. In the User Module Placement view, the NAME attribute is the name that appears in the Parameter Pane grid control. The ORDER attribute determines the order that the parameters appear, where the ORDER "0" parameter is at the top with the remaining parameter listed down in ascending order. If the ORDER attribute is not specified, then the parameters are listed in alphabetical order.

The SOURCE, REGISTER_NAME, and BITFIELD attributes specify the PSoC block, or resource, and the bitfield, in the shape that contains the bitfield associate with the parameter. The SOURCE must be set to a NAME included in the <SHAPE> element of a <BLOCK> element, or of a <RESOURCE> element. The REGISTER_NAME and BITFIELD attributes must also be included in the <BLOCK> or <RESOURCE> element. A special keyword for the SOURCE attribute is ALL_DIGITAL. If the SOURCE for a parameter is set to ALL_DIGITAL, then the parameter applies to a similar bitfield for all digital PSoC blocks defined in the User Module. This value can be used to set all clocks for the digital blocks to the same value.

The VALUE attribute specifies the default value for the parameter. In the case of a parameter that does not include a <PARAMETER_VALUE_LIST> element, the VALUE attribute must be included in the <BITVALUE_LIST> of the bitfield associated with the parameter. If a <PARAMETER_VALUE_LIST> is included, then the VALUE attribute value must be included in the <PARAMETER_VALUE_LIST> element.

The TYPE attribute may be a UI helper that controls the appearance of parameters on the PSoC blocks in the Placement Pane. When a User Module is placed on to the PSoC blocks, some of the parameters may be shown on the blocks. When parameters are shown on the PSoC blocks, then they may be set from the Placement Pane by clicking on the active area for the parameter on the block, as shown in the Parameter Block Selection screen. The enumerated values of the TYPE attribute determine where on the block the active area for the parameter is shown. The valid values for the TYPE attribute are described below.

The CLOCK attribute may be the clock selection parameter. The INPUT attribute may be the input parameter. The INPUT_MUX attribute may be the special MUX input parameter. The INPUT_HIDDEN attribute may be the hidden parameter for input. The BLOCK attribute may be the general block parameters. The BLOCK_HIDDEN attribute may be hidden parameter for a block. The OUTPUT attribute may be the general output parameter. The OUTPUT_O attribute may be the output parameter to comparator bus. The OUTPUT_I attribute may be the output parameter to analog bus. The OUTPUT_O_HIDDEN attribute may be the hidden parameter to comparator bus. The OUTPUT_I_HIDDEN attribute may be the hidden parameter to analog bus. The API attribute may be the parameter not associated with any bitfields.

The preferred embodiment of the present invention, a method and apparatus for generating microcontroller configuration information, is thus described. While the present invention has been described in particular embodiments, it should be appreciated that the present invention should not be construed as limited by such embodiments, but rather construed according to the below claims.

What is claimed is:

1. A non-transitory computer-readable storage medium comprising computer executable instructions that when executed by a processor, perform operations comprising:
   accessing a plurality of configurations stored in a memory, each configuration associated with a corresponding circuit function implementable by an electronic device and a corresponding set of resources of the electronic device;
   determining that one or more sets of resources of the electronic device are available for use by one or more configurations of the plurality of configurations;
   based on the determination, representing a first configuration of the one or more configurations, using a graphical interface;
   receiving via the graphical interface a parameter value through an active area of the graphical representation of the first configuration; and
   generating instructions that when executed cause the electronic device to be configured according the first configuration.

2. The non-transitory computer-readable storage medium of claim 1, wherein the generating of the instructions is responsive to receiving user selection of the representation of the first configuration.

3. The non-transitory computer-readable storage medium of claim 1, wherein the electronic device includes a programmable device comprising a plurality of reconfigurable blocks that are configured to be combined in a first combination of blocks associated with a first circuit function and recombined in a second combination of blocks associated with a second circuit function.

4. The non-transitory computer-readable storage medium of claim 1, wherein the resources include hardware resources of the electronic device.

5. The non-transitory computer-readable storage medium of claim 1, wherein the resources of the electronic device include a plurality of circuit blocks, wherein at least one circuit block, of the plurality of circuit blocks, is reconfigurable to be used in the first configuration and reconfigurable to be used in a second configuration, of the plurality of configurations.

* * * * *